United States Patent
Williams et al.

(10) Patent No.: US 8,004,299 B2
(45) Date of Patent: Aug. 23, 2011

(54) CANTILEVER PROBE STRUCTURE FOR A PROBE CARD ASSEMBLY

(75) Inventors: Scott R. Williams, St. George, UT (US); Edward Laurent, North Wales, PA (US); David T. Beatson, Kennett Square, PA (US); Bahadir Tunaboylu, Chandler, AZ (US); Edward L. Malantonio, Conshohocken, PA (US)

(73) Assignee: SV Probe Pte. Ltd., Singapore (SG)

( * ) Notice: Subject to any disclaimer, the term of this patent is extended or adjusted under 35 U.S.C. 154(b) by 0 days.

(21) Appl. No.: 13/038,140

(22) Filed: Mar. 1, 2011

(65) Prior Publication Data
US 2011/0148449 A1    Jun. 23, 2011

Related U.S. Application Data

(63) Continuation of application No. 11/529,784, filed on Sep. 29, 2006.

(60) Provisional application No. 60/722,351, filed on Sep. 30, 2005.

(51) Int. Cl.
*G01R 1/067*    (2006.01)
*G01R 31/00*    (2006.01)

(52) U.S. Cl. .......... 324/755.07; 324/755.01; 324/756.03

(58) Field of Classification Search ............. 324/755.07, 324/755.01
See application file for complete search history.

(56) References Cited

U.S. PATENT DOCUMENTS

| | | | |
|---|---|---|---|
| 4,599,559 A | 7/1986 | Evans | |
| 5,670,889 A * | 9/1997 | Okubo et al. | 324/756.03 |
| 6,037,785 A | 3/2000 | Higgins | |
| 6,329,827 B1 | 12/2001 | Beaman et al. | |
| 6,482,013 B2 | 11/2002 | Eldridge et al. | |
| 6,835,589 B2 | 12/2004 | Pogge et al. | |
| 2001/0012739 A1 | 8/2001 | Grube et al. | |
| 2002/0019152 A1 | 2/2002 | Eldridge et al. | |
| 2002/0151194 A1 | 10/2002 | Grube et al. | |
| 2003/0155940 A1 | 8/2003 | Lee et al. | |
| 2004/0142583 A1 | 7/2004 | Mathieu et al. | |
| 2005/0110507 A1 | 5/2005 | Koizumi et al. | |

FOREIGN PATENT DOCUMENTS

| | | |
|---|---|---|
| WO | WO 03/067650 A | 8/2003 |
| WO | WO 03/071289 A | 8/2003 |
| WO | WO 2005/065438 A2 | 7/2005 |

OTHER PUBLICATIONS

International Searching Authority, "International Search Report with Written Opinion", Application No. PCT/US2006/038633, dated Mar. 13, 2007, 14 pages.
Current Claims, PCT/US2006/038633, 4 pages.

* cited by examiner

*Primary Examiner* — Roberto Velez
(74) *Attorney, Agent, or Firm* — Hickman Palermo Truong & Becker LLP

(57) ABSTRACT

A probe for a probe card assembly includes a beam and a fulcrum element. The fulcrum element is positioned between a base end portion of the beam and a tip end portion of the beam and is adapted for contact with the beam such that the beam is cantilevered by the fulcrum.

10 Claims, 23 Drawing Sheets

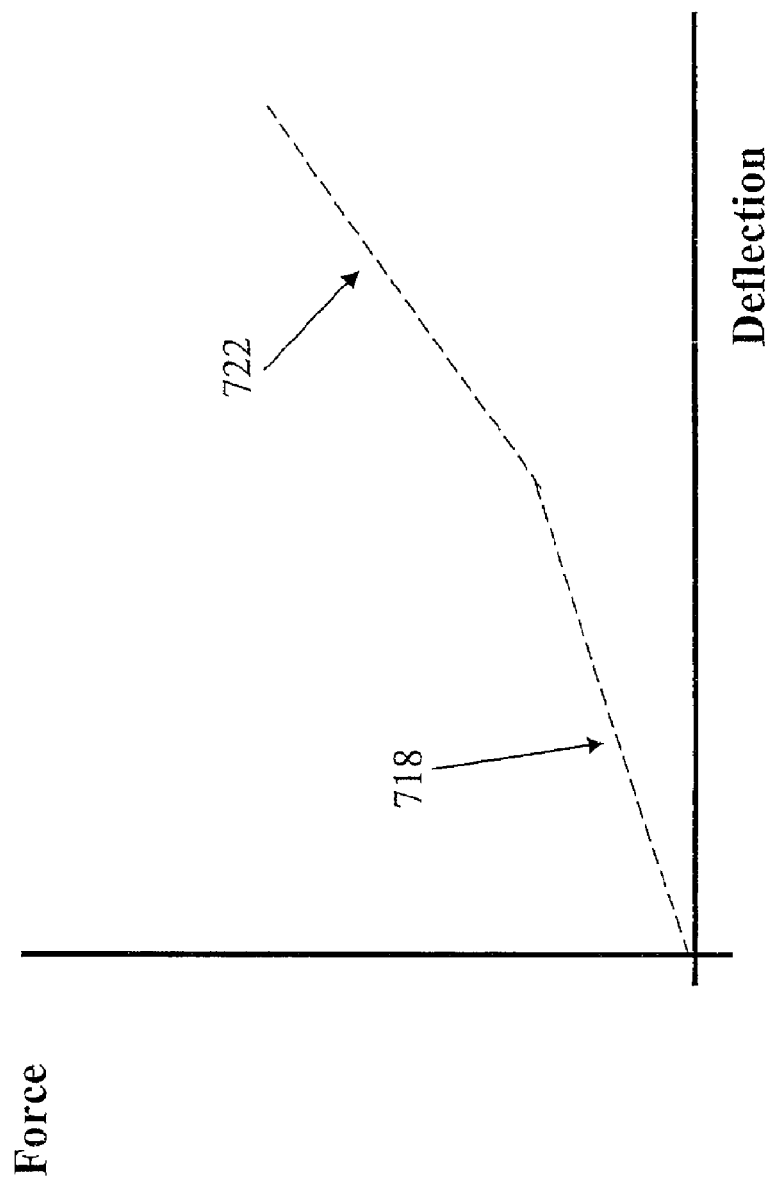

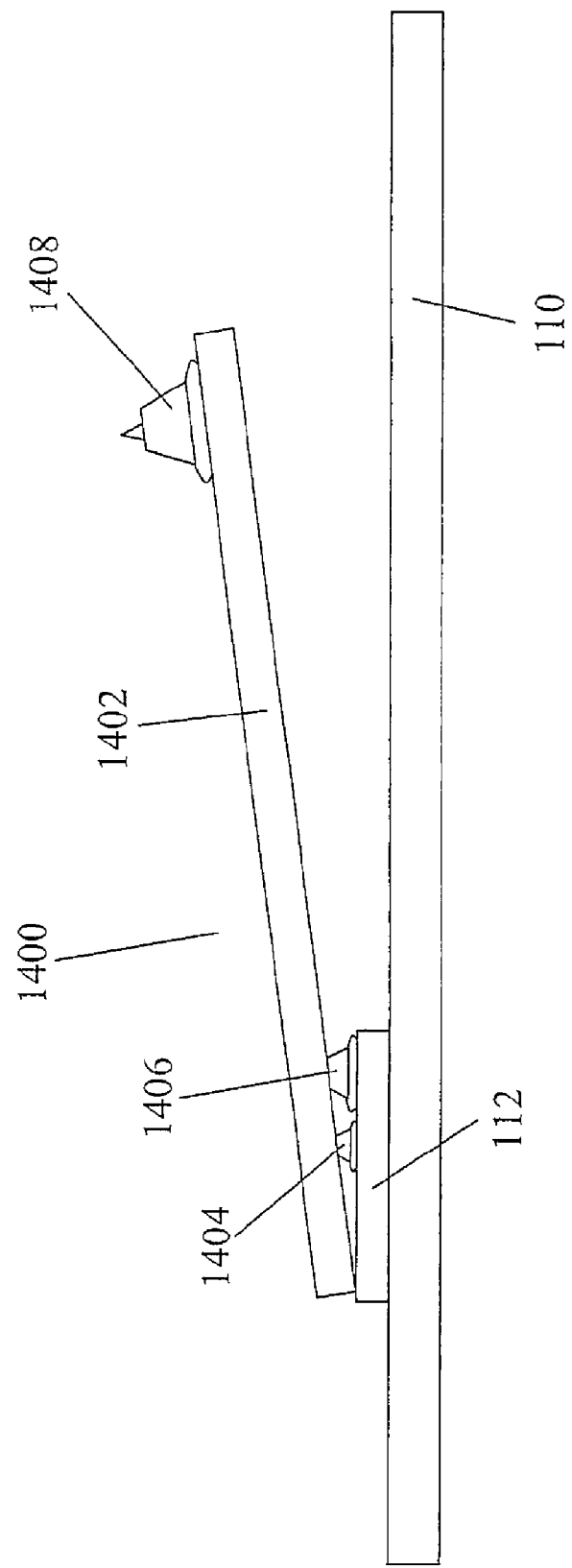

CANTILEVER PROBE STRUCTURE FOR A PROBE CARD ASSEMBLY

CROSS REFERENCE TO RELATED CASES

This application is a continuation of U.S. patent application Ser. No. 11/529,784, filed Sep. 29, 2006, which claims benefit of U.S. provisional application 60/722,351, filed Sep. 30, 2005, each of which is incorporated herein by reference as if fully set forth herein, under 35 U.S.C. §120.

FIELD OF THE INVENTION

The present invention relates to equipment for testing of integrated circuits. More particularly, the present invention relates to probe elements of a probe card assembly for wafer testing of integrated circuits.

BACKGROUND OF THE INVENTION

It is conventional to test semiconductor integrated circuits ("ICs") during manufacture to ensure the integrity of the ICs. In a testing technique known as wafer testing, wafer-mounted ICs (or dies) are tested by establishing electrical current between test equipment such as a tester [e.g., automatic test equipment (i.e., ATE)] and each IC (or die) on the wafer. An example component that may be used in wafer testing is a test board, for example, a multilayered printed circuit board (PCB) connected to the test equipment to transfer test signals between the test equipment and a he ICs to be tested. The PCB may be included in what is often referred to as a probe card or a probe card assembly.

The probe card includes probe elements (e.g., needles, prongs, pins, beams, etc.) arranged for contact with a series of electrical terminals (or contacts) located on a semiconductor wafer. Conventional probe cards generally include a substrate, such as a space transformer, located between the probes and the PCB and adapted to electrically connect the probes to contacts on the PCB. Example space transformers may be formed from a multi-layer ceramic or organic substrate and includes conductive traces extending along and/or through the various layers of the substrate. For example, the probes of the probe card may be mounted to electrically conductive, preferably metallic, bonding pads formed on the substrate, such as by conventional plating or etching techniques well known in the art of semiconductor fabrication.

Referring to FIG. 1, there is shown prior probe 10 (of a probe card assembly) supported on substrate 12. Probe 10 includes beam 14 having base end 16 and tip end 18 and contact tip 20 adjacent tip end 18. Contact tip 20 of probe 10 is adapted for contact with a terminal (or contact) located on a device under test (DUT). Probe 10 also includes post 22 located on an upper surface of substrate 12 (e.g., on a trace or a contact pad/terminal of substrate 12). Beam 14 of prior probe 10 is attached to post 22 (e.g., using a tape automated bonding (TAB) process). For example, post 22 of prior probe 10 is attached to a contact pad (not shown) located on substrate 12. As shown, post 22 supports beam 14 of probe 10 such that beam 14 is cantilevered from post 22. Accordingly, this type of probe is sometimes referred to as a cantilever probe. Cantilever probes are typically used for testing devices such as memory or logic devices, which include relatively large spacing between rows or columns of terminals, or devices having terminals located about a periphery of the device.

The probe-mounting surface (e.g., the surface of a space transformer) for a probe card assembly is typically maintained within a flatness tolerance to control the resulting position of contact tips 20 of the probes, which may number in the hundreds or more. Substantial planarity of the probe-mounting surface desirably promotes uniformity in contact tip position (i.e., desirably promotes a substantially coplanar arrangement for those portions of the probes adapted to contact a DUT such as contact tip 20 of FIG. 1). The probe-mounting surface for a probe card, however, is not perfectly flat. Accordingly, the DUT-contacting portions of multiple contact tips 20 will not be co-planar. Variations in the position of contact tips 20 may also result from other factors (e.g., dimensional variations in the posts, beams, and contact tips of the probes; non-linearity of the beams; etc.). The cantilevered construction of beam 14 of probe 10 is adapted to provide deflection (i.e., flex) at tip end 18 when transverse load is applied to contact tip 20, such as when force is applied to beam 14 during contact of contact tip 20 with a DUT. This flexing capability of beam 14 of probe 10 desirably accommodates the above-described non-planarity in the position of contact tips 20, as well as non-planarity in the position of terminals on a DUT being contacted by tips 20, thereby ensuring that an electrical connection is established between the DUT and each probe 10 of the probe card assembly.

The height of contact tip 20 of prior probe 10 is selected to account for the deflection of tip end 18 that is expected during testing operations. For example, if the anticipated maximum deflection of tip end 18 of beam 14 is 0.003 inches, contact tip 20 should project more than 0.003 inches from tip end 18. Otherwise, a DUT might be brought into contact with the base end 16 of beam 14. For similar reasons, post 22 should have a height that is greater than the maximum anticipated deflection of tip end 18 of beam 14 to prevent contact between tip end 18 and the probe-mounting surface of substrate 12.

The construction of the prior probe 10, including beam and post elements, has been provided to promote the above-described desired uniformity in the position of contact tips 20 for a probe card incorporating probe 10. As should be understood, however, a probe card incorporating prior probe 10 desirably includes posts 22 having upper surfaces that are substantially co-planar with each other in order to provide precise location of contact tips 20 (e.g., substantial planarity). Such planarity between posts 22, however, involves posts 22 being formed with substantially planar surfaces and that the placement of posts 22 onto substrate 12 maintain a substantially co-planar arrangement between posts 22. In practice, this is a difficult and time consuming process. Thus, it would be desirable to provide a more easily manufactured, cost-effective, probe for a probe card providing tips adapted for precise positioning within tight tolerances.

SUMMARY OF THE INVENTION

According to an example embodiment of the present invention, a probe for a probe card assembly is provided. The probe includes a beam and a fulcrum element. The fulcrum element is positioned between a base end portion of the beam and a tip end portion of the beam and is adapted for contact with the beam such that the beam is cantilevered by the fulcrum element.

According to another example embodiment of the invention, a probe card assembly is provided. The probe card assembly includes a substrate defining a surface and a plurality of probes each including a beam having a base end portion and a tip end portion. The base end portion of the beam is fixed with respect to the surface of the substrate. The probe card assembly also includes at least one fulcrum element located between the base end portion of the beam and the tip end portion of the beam. The beam of each probe is adapted for contact with one of the at least one fulcrum element such that the beam is cantilevered by the fulcrum element.

According to yet another example embodiment of the invention, a probe card assembly is provided. The probe card assembly includes a substrate and a plurality of probes. Each of the probes includes a beam having a base end portion and a tip end portion. The beam defines a bend adjacent the base end portion, and the base end portion of the beam is fixed with respect to the substrate.

BRIEF DESCRIPTION OF THE DRAWINGS

For the purpose of illustrating the invention, there are shown in the drawings a form of the invention that is presently preferred; it being understood, however, that this invention is not limited to the precise arrangements and instrumentalities shown.

It is emphasized that, according to common practice, the various features of the drawing are not to scale. On the contrary, the dimensions of the various features are arbitrarily expanded or reduced for clarity. Included in the drawing are the following figures:

FIG. 9B is a graph illustrating the deflection of the probe of FIG. 9A in response to applied force;

FIG. 14A is a side view of a probe and a substrate in accordance with yet another example embodiment of the present invention.

DETAILED DESCRIPTION OF THE INVENTION

As used herein, the terms "fulcrum" or "fulcrum element" refers to a structure that is adapted to contact a beam of a probe between a base end portion of the beam and a tip end portion of the beam such that the beam is cantilevered with respect to the fulcrum element. The fulcrum element may be a member that is initially separate from an underlying substrate. Alternatively, the fulcrum element could comprise an integrally formed portion of an underlying substrate. Also, the term "fulcrum" should not be understood as requiring that a beam contacting the fulcrum be capable of pivoting as a lever about an axis defined by the fulcrum.

As used herein, the term "cantilevered" refers to an elongated beam member, and more particularly, to an elongated beam member supported such that an end of the beam member is unsupported to deflect under a transversely applied load.

As used herein, the terms "probe" or "probe element" refer to any conductive structure configured for probing a conductive region of a semiconductor device (e.g., a semiconductor device prior to singulation from a wafer, a packaged semiconductor device already singulated from a wafer, etc.). Thus, the terms "probe" or "probe element" include such structures including portions having any of a number of shapes/configurations (e.g., straight beam members, bent beam members, curved members, etc.) and structures formed from any of a number of processes (e.g., plating process such as lithographic processes, subtractive processes such as etching or stamping, etc.).

Figure 1:
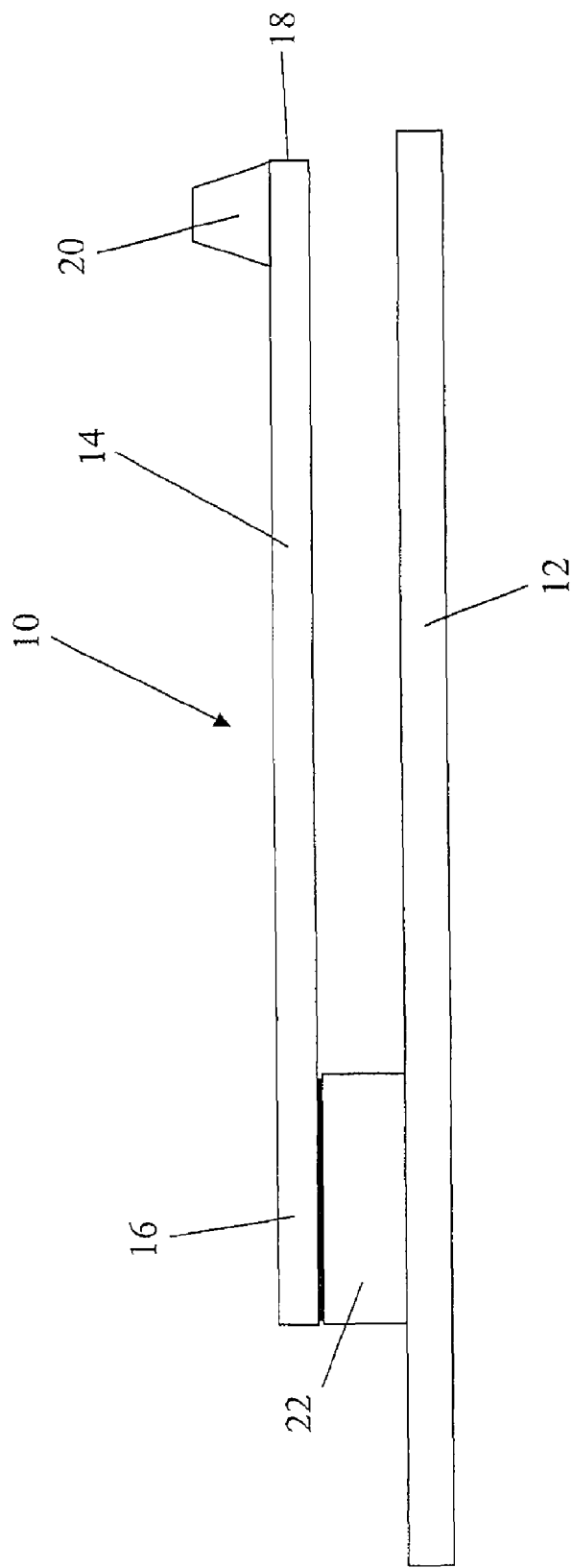
FIG. 1 is a side view of a prior probe for a probe card.
Figure 2:
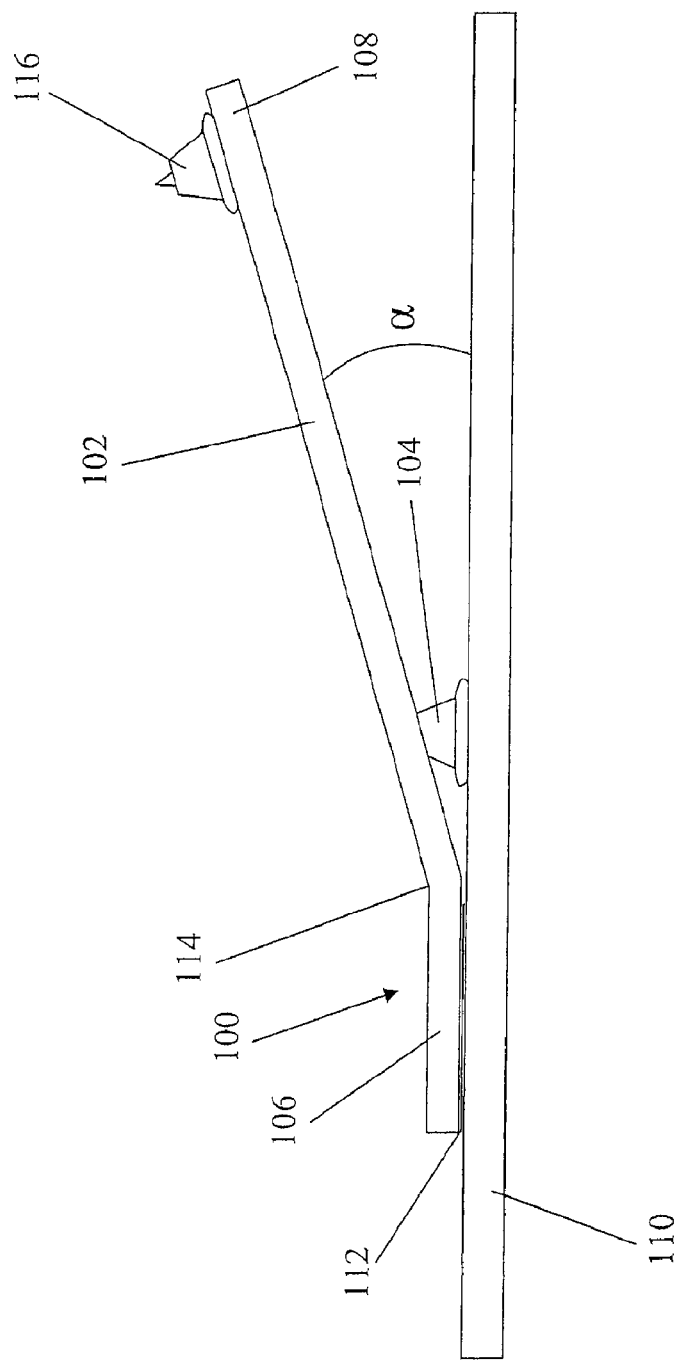
FIG. 2 is a side view of a probe and a substrate in accordance with an example embodiment of the present invention.

Referring to the drawings, wherein like reference numerals refer to like elements, there is shown in FIG. 2 probe 100 for a probe card assembly according to an example embodiment of the present invention including beam 102 and fulcrum element 104. Beam 102 of probe 100 is made from a conductive material (e.g., a spring element core such as a spring metal core with or without a conductive plating), for example, a metal such as nickel manganese. Beam 102 may also comprise a plating on an underlying core member (e.g., a nickel manganese core member), for example, a thin gold coating. Such a plating/coating may be provided for various reasons, for example, to provide superior conductivity or to provide a malleable material for bonding thereto (e.g., for bonding the beam to a substrate, for bonding a tip to the beam, etc.).

As shown, fulcrum element 104 of probe 100 is located between base end portion 106 of beam 102 and tip end portion 108 of beam 102 such that tip end portion 108 of beam 102 is cantilevered with respect to fulcrum element 104.

Base end portion 106 of beam 102 is coupled to substrate 110 (e.g., a space transformer) such that base end portion 106 is fixed with respect to substrate 110. Substrate 110 may be a space transformer (e.g., a multi-layer ceramic or organic space transformer) including conductive regions (e.g., contact pads, conductive traces, contact terminals, etc.) on a surface thereof in contact with probe 100. For example, the conductive region may be an end portion of a conductive via extending through a surface of substrate 110. Another example conductive region is a conductive trace plated onto a surface of substrate 110, using, for example, photolithography or the like. Of course, other example conductive regions are contemplated.

Thus, beam 102 of example probe 100 is attached to conductive region 112 (e.g., contact pad 112, conductive trace 112, contact terminal 112, etc.), which is provided at or near the upper surface of substrate 110. Beam 102 may be attached to conductive region 112, for example, by bonding beam 102 using a tape automated bonding (TAB) process. It is contemplated that beam 102 could be adapted for attachment directly to substrate 110.

Fulcrum element 104 of probe 100 is mounted to the upper surface of the substrate 110 at a location between base end portion 106 of beam 102 and tip end portion 108. Fulcrum element 104 of example probe 100 comprises a stud bump secured to substrate 110 (e.g., a stud bump bonded to substrate 110 using a wire bonding tool such as a capillary tool). Example materials for fulcrum element 104 include gold, gold-plated nickel, beryllium copper, beryllium nickel, platinum, palladium and steel alloys including stainless steel. Fulcrum element 104 may be secured to substrate 110 using any suitable technique including soldering, brazing, bonding (e.g., ultrasonic bonding, thermocompressive bonding, thermosonic bonding, etc.), and conductive adhesive. Example fulcrum element 104 has also been formed, by a suitable configured forming tool, for example, to include a tapering upper portion. It is not a requirement of the invention that fulcrum element 104 be shaped in this manner. Alternate constructions are conceived such as a stud bump flattened into a substantially oval shape (e.g., a coined stud bump).

Beam 102 of probe 100 includes bend 114 adjacent base end portion 106 of beam 102 such that beam 102 extends toward tip end portion 108 from base end portion 106 at an oblique angle a with respect to base end portion 106. For example, the oblique angle may be less than approximately 30 degrees. As shown, fulcrum element 104 is located and dimensioned such that the obliquely-oriented portion of beam 102 contacts a portion of fulcrum element 104. Supported in this manner such that base end portion 106 is fixed with respect to substrate 110 and the oblique portion contacts fulcrum element 104, tip end portion 108 of beam 102 will deflect as a cantilevered beam in response to a transversely applied load (e.g., loading during wafer testing of a semiconductor device). It should be understood that a similarly configured beam could be used with a fulcrum element located at a different location from that shown in FIG. 2 by adjusting the height of the fulcrum element. Beam 102 could be bent prior to attachment of beam 102 to substrate 110. Alternatively, beam 102 could comprise an initially straight member that becomes bent during the attachment of beam 102 to substrate 110 or terminal. Further still, according to certain example embodiments of the present invention, the probes do not include a bend such as bend 114 in beam 102. The inclusion of bend 114, however, provides additional surface area, as shown, in contact with substrate 110, or a conductive region provided on substrate 110, to facilitate a bonding attachment of beam 102, for example.

Fulcrum element 104 of example probe 100 includes an upper surface that is sloped at an angle that substantially matches that of the obliquely angled portion of beam 102. Such an angled upper surface of fulcrum element 104 may be configured during the forming of fulcrum element 104, or the angled upper surface may be formed during contact between beam 102 and fulcrum element 104. Of course, it is not required that the fulcrum element include an angled upper surface in this manner. Alternative constructions are conceived, such as a fulcrum having an upper surface that is substantially parallel to the upper surface of substrate 110 such that the beam 102 initially contacts fulcrum element 104 at one side or contact point of the fulcrum.

Probe 100 includes contact tip 116 located adjacent tip end portion 108 of beam 102, for contact with a terminal of a DUT, for example. At least partially because of the obliquely-angled orientation of tip end portion 108 of beam 102, the deflection of tip end portion 108 will include a lateral component of motion. Such lateral motion of tip end portion 108 may create a scrubbing action between probe 100 and a terminal of a DUT desirably tending to remove oxides or other contaminants from the surface of the terminal. The example depicted contact tip 116 comprises a stud bump secured to beam 102 such as by soldering, brazing, bonding (e.g., ultrasonic bonding, thermosonic bonding, thermocompressive bonding, etc.), or conductive adhesive, for example. Other constructions are conceived such as a projecting member formed integrally with beam 102. It is not a requirement of the invention, however, that probe 100 include a projecting contact tip, separately or integrally formed. In embodiments of the present invention where the contact tip is not integral with the beam, the contact tip may be secured to the beam before or after the beam is secured to the substrate.

Figure 3:
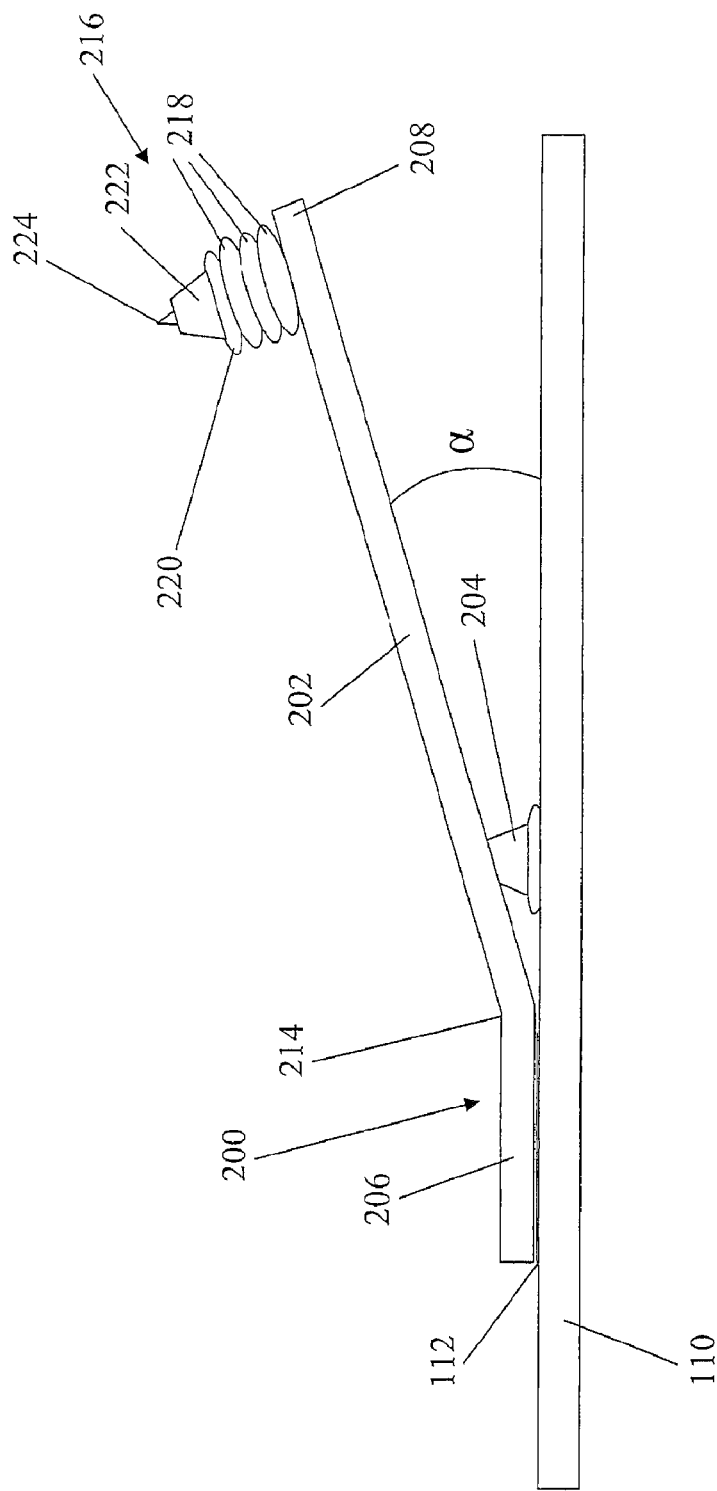
FIG. 3 is a side view of a probe and a substrate in accordance with another example embodiment of the present invention.

Referring now to FIG. 3, there is shown cantilevered probe 200 according to another example embodiment of the invention. Probe 200 includes beam 202 and fulcrum element 204 located between base end portion 206 of beam 202 and tip end portion 208 of beam 202. Similar to probe 100 of FIG. 2, example probe 200 includes a bend 214 adjacent base end portion 206 such that tip end portion 208 of beam 202 is oriented at an oblique angle a with respect to base end portion 206. Fulcrum element 204 is similar to fulcrum element 104 of FIG. 2 comprising a stud bump having a tapered upper portion and an upper surface sloped at an angle substantially parallel to the obliquely angled portion of beam 202.

Probe 200 includes contact tip 216 adjacent tip end portion 208 of beam 202. Contact tip 216 of probe 200 comprises a plurality of flattened or coined bumps 218 (e.g., stud bumps formed using a bonding tool) and an upper bump 220 that includes substantially conical body portion 222 and pointed contact finger 224. The upper bump may be shaped after deposition (e.g., shaped using a shaping tool) or may be shaped in the manner it is deposited, for example, using a wire bonding tool. Example contact tip 216 includes three coined bumps 218. It should be understood, however, that the number of coined bumps could vary from that shown.

For example, contact tip 216 of probe 200 may be formed in the following example manner. A first stud bump is secured to beam 202 such as by soldering, brazing, bonding (e.g., ultrasonic bonding, thermosonic bonding, thermocompressive bonding, etc.), or adhesion. The bump is then flattened using a suitable forming tool to form the bump into one of coined bumps 218. This process is then repeated to secure and flatten subsequent ones of coined bumps 218 to a previously secured coined bump 218 such that a stack is created. Upper bump 220 is then secured to the stack of coined bumps 218 and may be formed using a suitably configured shaping tool.

Figure 4:
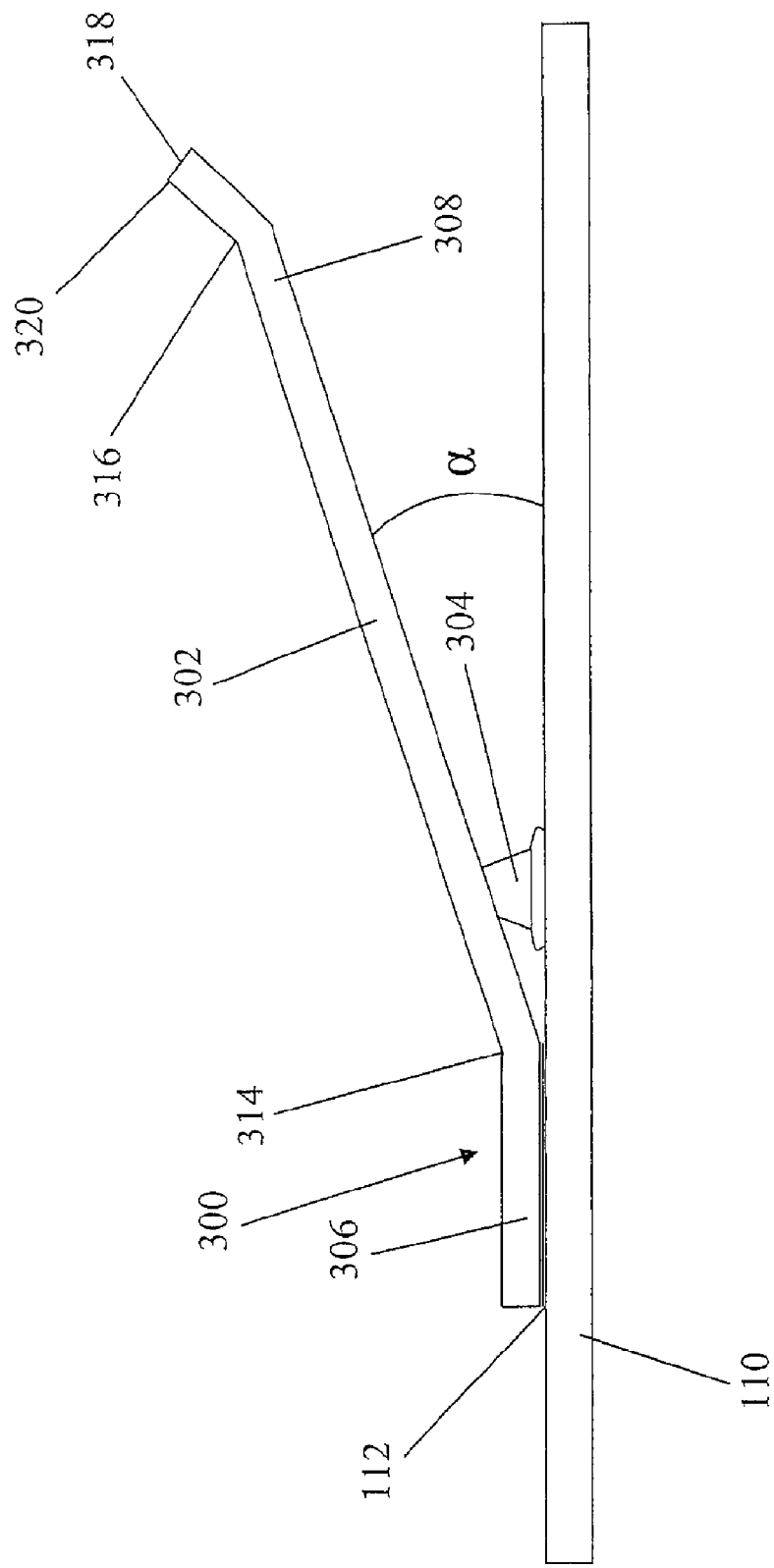
FIG. 4 is a side view of a probe and a substrate in accordance with yet another example embodiment of the present invention.

Referring to FIG. 4, probe 300 according to another example embodiment of the invention includes beam 302 and fulcrum element 304. Fulcrum element 304 is located between base end portion 306 of beam 302 and tip end portion 308 of the beam 302. Similar to probe 100 of FIG. 2, the example probe 300 includes bend 314 adjacent base end portion 306 of beam 302 such that tip end portion 308 of beam 302 is oriented at an oblique angle a with respect to base end portion 306. The depicted fulcrum element 304 is similar to fulcrum element 104 of FIG. 2 comprising a stud bump having a tapered upper portion and an upper surface sloped at an angle substantially parallel to the obliquely angled portion of beam 302.

The depicted probe 300 does not include a contact tip that is separately formed and secured to beam 302 as described above for probes 100, 200. Instead, second bend 316 is included in beam 302 adjacent tip end portion 308 to increase the angle between beam 302 and substrate 110 from that provided by bend 314. Contact between probe 300 and a DUT will occur at or near edge 320 of the beam 302 located at terminal end 318 of beam 302. An alternative construction is conceived in which terminal end 318 is adapted to contact a DUT without a bend 316 being included in beam 302.

In each of FIGS. 2 through 4, only one probe, respectively 100, 200, 300, is shown. It should be understood, however, that probe card assemblies respectively incorporating probes 100, 200, 300 (and other probes within the scope of the present invention) would each include multiple probes mounted to a substrate (e.g., a space transformer).

Figure 5:
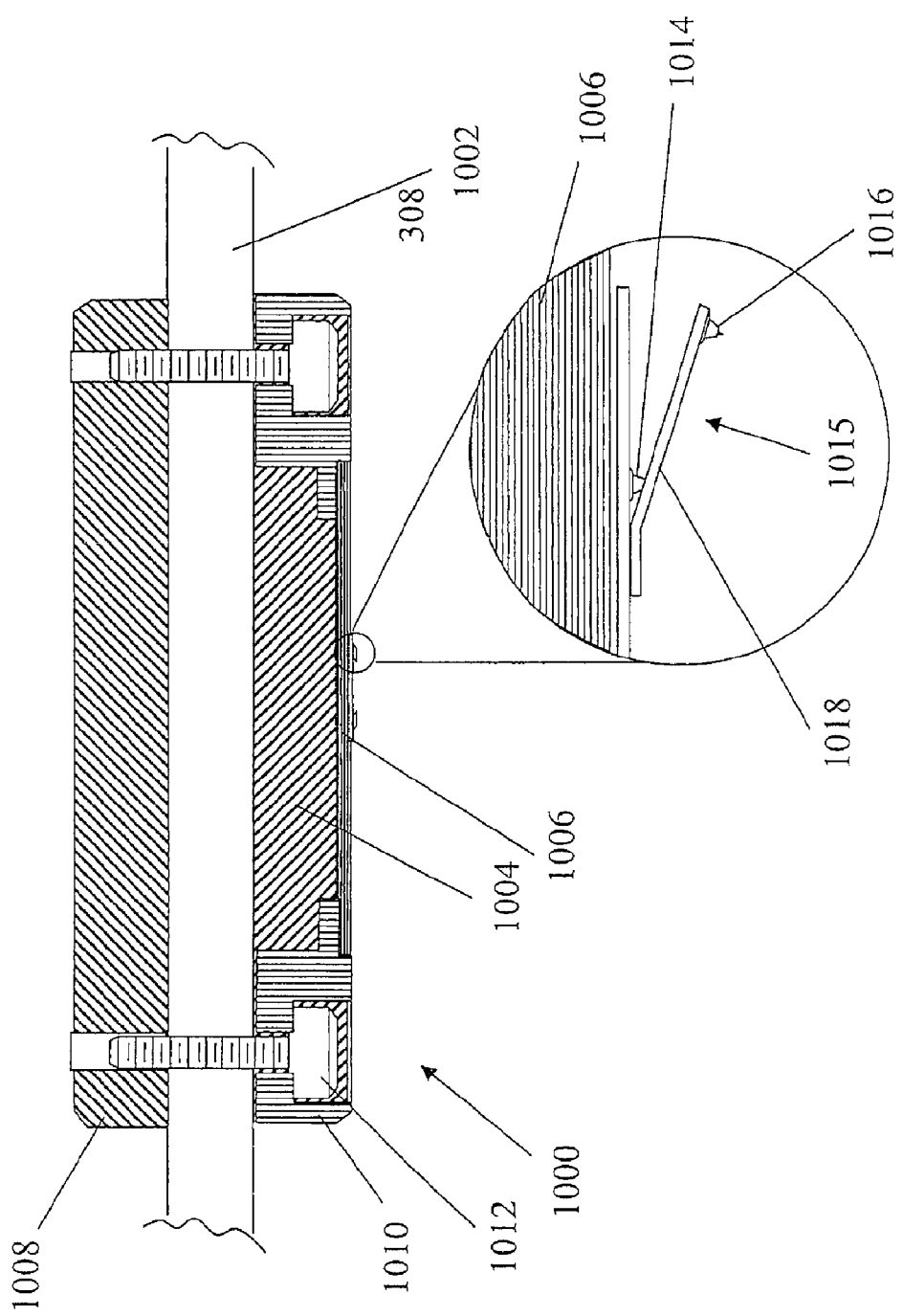
FIG. 5 is a cut away view of a portion of a probe card assembly including a detailed view of a probe in accordance with an example embodiment of the present invention.

Referring now to FIG. 5, there is illustrated a portion of a probe card assembly 1000 including two rows of probes 1015 (as configured for certain memory devices) according to an example embodiment of the invention. Probe card assembly 1000 includes PCB 1002, substrate 1006 (e.g., a space transformer 1006), and interposer 1004 (e.g., a spring pin or pogo pin based interposer) disposed between PCB 1002 and substrate 1006, as is known to those skilled in the art. Example probe card assembly 1000 also includes stiffener elements 1008 and 1010, as well as fasteners 1012.

A detailed view of an example probe 1015 coupled to substrate 1006 according to an example embodiment of the present invention is also shown in FIG. 5. Probe 1015 includes beam 1018, fulcrum element 1014, and contact tip 1016. Any other probe within the scope of the present invention may also be included as part of a probe card assembly, such as that shown in FIG. 5.

While an example configuration of a probe card assembly is shown in FIG. 5, the present invention is not limited thereto. Various probe card configurations as are known to those skilled in the art are contemplated.

Figure 6A:
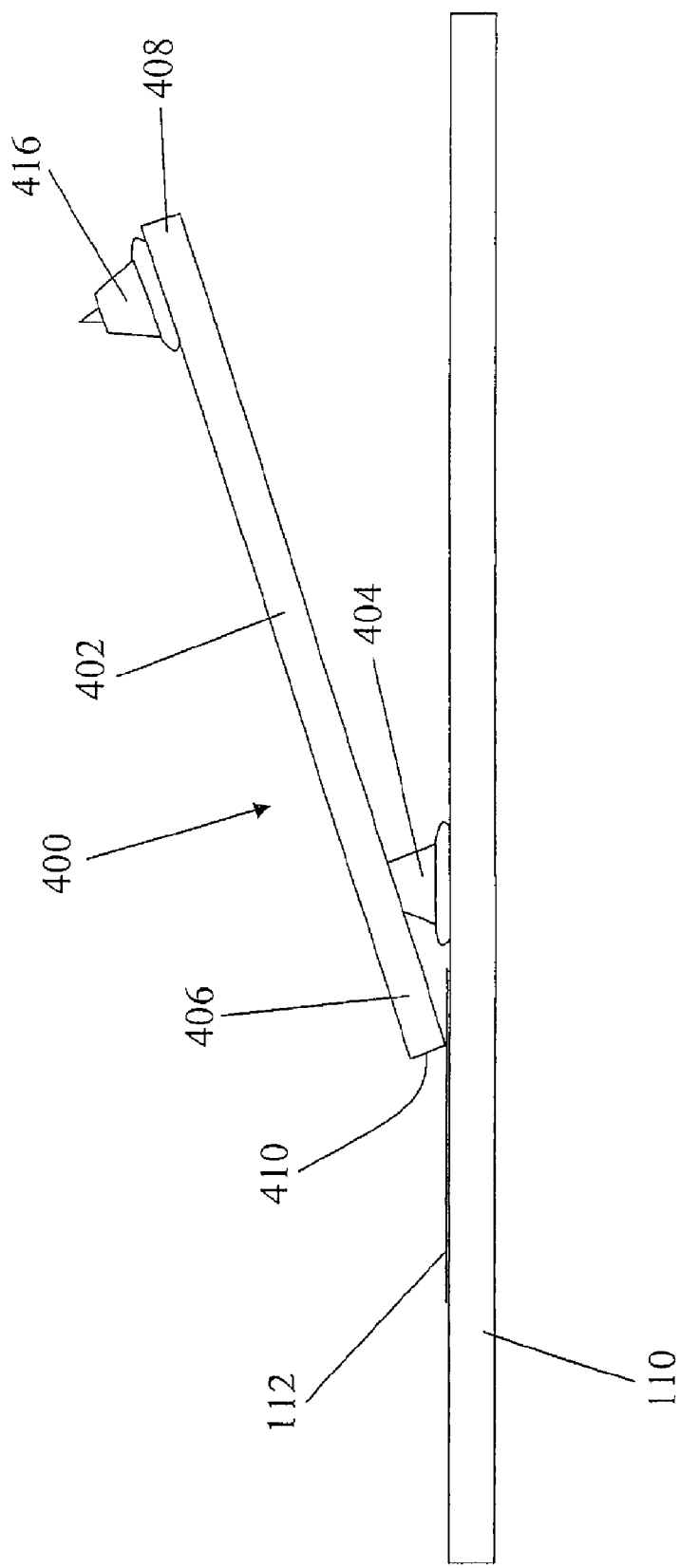
FIG. 6A is a side view of a probe and a substrate in accordance with yet another example embodiment of the present invention.

The beam included in each of the above-described probes of FIGS. 2-4 includes a bend adjacent the base end portion. As described above, the bend may provide increased surface area for bonding the base end portion of the beam to a conductive region of a substrate. It is not required, however, that the beam include a bend. Referring to FIG. 6A, there is shown probe 400 according to an alternative embodiment of the invention. Probe 400 includes beam 402 and fulcrum element 404 located between base end portion 406 of beam 402 and tip end portion 408 of beam 402. As shown, beam 402 does not include a bend adjacent base end portion 406. Instead, beam 402 extends in substantially straight manner into base end portion 406 for attachment to conductive region 112 on substrate 110 adjacent end 410 of beam 402. The support of beam 402 in this manner, in which base end portion 406 is fixed with respect to substrate 110 and beam 402 contacts fulcrum element 404, results in tip end portion 408 of beam 402 being cantilevered with respect to fulcrum element 404. Similar to the above-described probes 100, 200, 300, beam 402 of probe 400 extends from fulcrum element 404 at an oblique angle a with respect to an upper surface of substrate 110. Probe 400 includes contact tip 416 adjacent tip end portion 408 of beam 402, which in the depicted embodiment comprises a stud bump including a conically shaped portion.

Figure 6B:
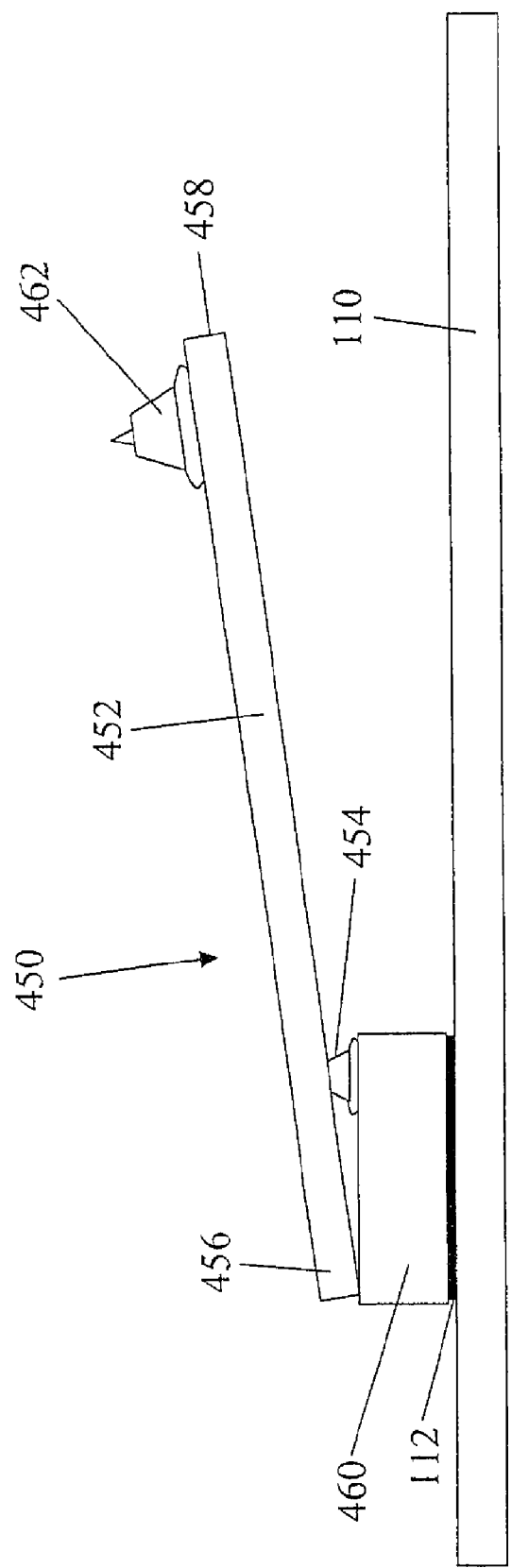
FIG. 6B is a side view of a probe and a substrate in accordance with yet another example embodiment of the present invention.

FIG. 6B illustrates another example embodiment of the present invention with a beam without an intentional bend. More specifically, probe 450 includes substantially straight beam 452 including base end portion 456 and tip end portion 458. Probe 450 also includes conductive post 460 (e.g., a conductive post plated through lithographic techniques onto conductive region 112 of substrate 110). Fulcrum element 454 is provided on post 460. For example, fulcrum element 454 may be bump bonded onto post 460. Beam 452 (including contact tip 462) is secured to post 460 (e.g., by any of a number of techniques including, for example, TAB bonding) such that fulcrum element 454 biases beam 454 slightly upwards. Thus, during subsequent relative alignment of a plurality of probes 450 on substrate 110 (e.g., alignment of the probes in a vertical: or Z direction), the probes 450 may be each pushed downward to a relatively uniform position. Without the beams 454 being biased slightly upwards via fulcrum element 454, certain of the probes 450 on a substrate 110 may undesirably utilize pulling (which may weaken the bond to the post 460) in order to provide relative alignment with other probes 450.

Figure 7:
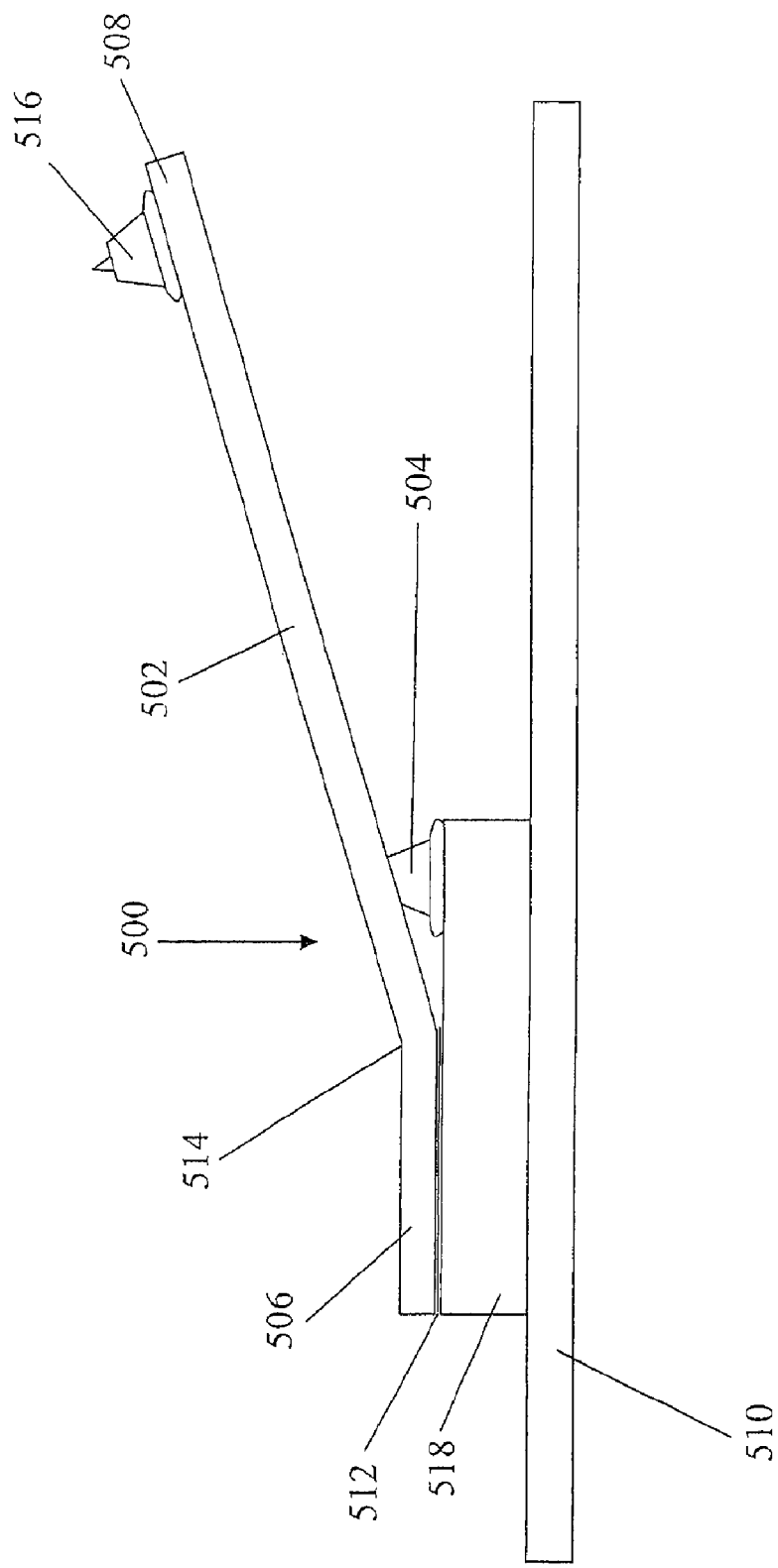
FIG. 7 is a side view of a probe and a substrate in accordance with yet another example embodiment of the present invention.

Referring to FIG. 7, there is shown probe 500 according to another example embodiment of the invention. Probe 500 includes beam 502 and fulcrum element 504 located between base end portion 506 of beam 502 and tip end portion 508. Like the beams of probes 100, 200, 300, beam 502 of probe 500 includes bend 514 adjacent base end portion 506. Like probe 100, probe 500 includes contact tip 516 adjacent tip end portion 508 of beam 502. In the depicted embodiment, contact tip 516 comprises a stud bump including a conically shaped portion.

In each of the above-described probes of FIGS. 2-4 and FIG. 6A, the base end portion of the associated beam is attached to a conductive region located at or near the surface of an underlying substrate. It is not a requirement of the invention, however, that the beam is attached to a terminal located at or near the upper surface of the substrate in order to fix the beam with respect to the substrate. As shown in FIG. 7, probe 500 includes post 518 located between substrate 510 and beam 502 for supporting base end portion 506 of beam 502 at a distance from substrate 510. This construction might be desired, for example, to provide additional clearance between tip end portion 508 of beam 502 and substrate 510 or to provide additional separation between substrate 510 and a DUT (not shown) during contact between contact tip 516 and a terminal of the DUT.

In the depicted embodiment of FIG. 7, base end portion 506 of beam 502 is attached to an upper surface of post 518, for example, by TAB bonding beam 502 to post 518. Fulcrum element 504, comprising a formed stud bump in the illustrated example embodiment, is attached to the upper surface of post 518 (e.g., by soldering, brazing, ultrasonic bonding, thermosonic bonding, thermocompressive bonding, or adhesive bonding). Beam 502 is supported such that base end portion 506 of beam 502 is fixed with respect to underlying substrate 510 and beam 502 contacts fulcrum element 504. This results in tip end portion 508 of beam 502 being cantilevered with respect to fulcrum element 504 at an oblique angle with respect to underlying substrate 510.

Figure 8:
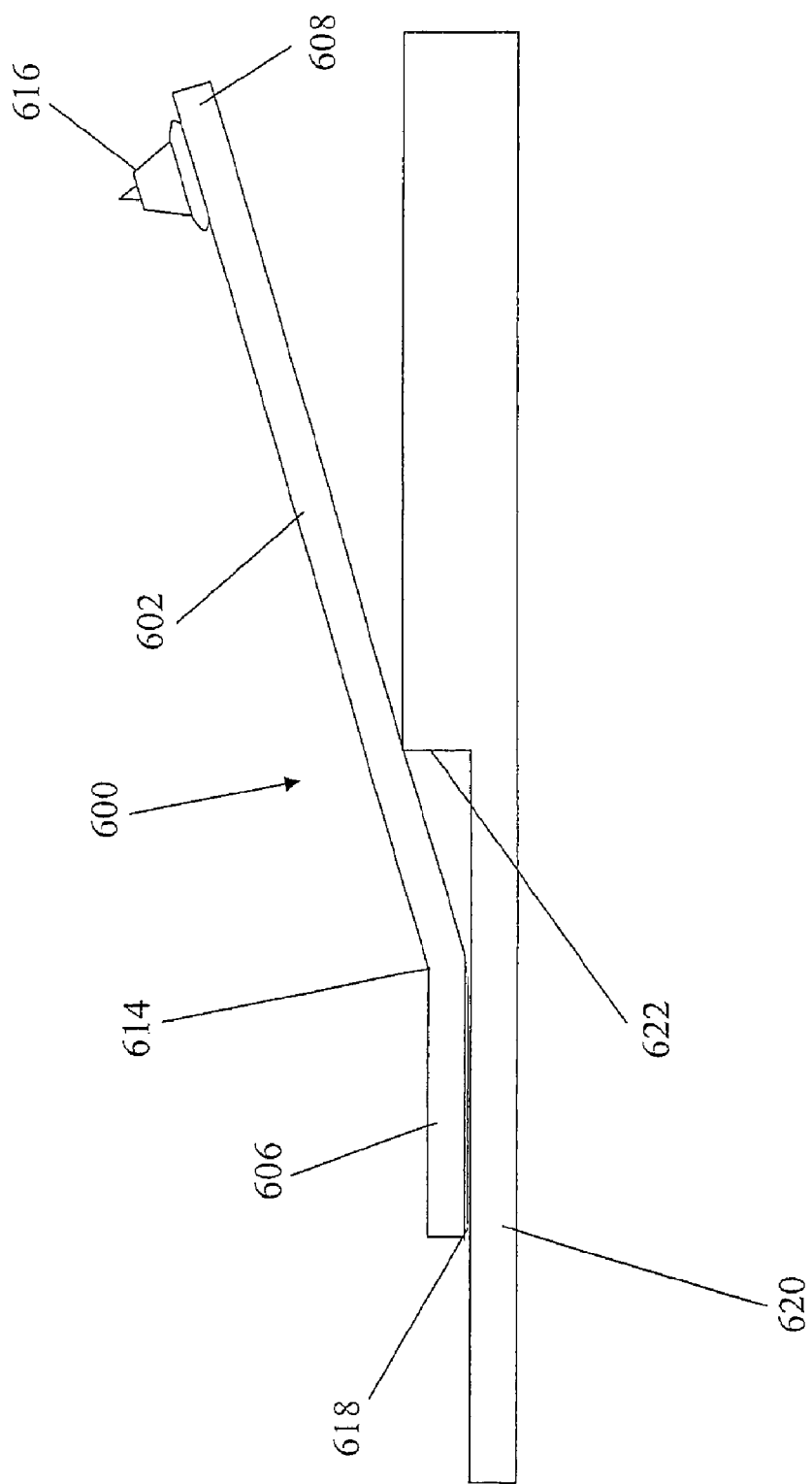
FIG. 8 is a side view of a probe and a substrate in accordance with yet another example embodiment of the present invention.

Each of the probes depicted in FIGS. 2-4 and FIGS. 6A-7 includes a fulcrum element comprising a separate member (e.g., a stud bump) secured to a substrate or to a post located on a substrate. It is not a requirement of the invention, however, that the fulcrum comprise an initially separate member secured to the substrate or post. Referring to FIG. 8, there is shown probe 600 according to another example embodiment of the invention. Probe 600 includes beam 602 having base end portion 606 and opposite tip end portion 608 and bend 614 adjacent base end portion 608. Probe 600 also includes contact tip 616 adjacent tip end portion 608 of beam 602. Base end portion 606 of beam 602 is attached to conductive region 618 located on or adjacent to a surface of substrate 620 (e.g., by TAB bonding beam 602).

Substrate 620 of the embodiment shown in FIG. 8 is tiered such that an upper surface of substrate 620 defines step 622. As shown, step 622 of substrate 620 is located between base end portion 606 of beam 602 and tip end portion 608. Arranged in this manner, step 622 of substrate 620 is adapted to contact beam 602 to function as a fulcrum analogously to the above-described fulcrum elements depicted in FIGS. 2-4, FIGS. 6A-B, and FIG. 7. As a result, beam 602 is cantilevered beyond step 622 toward tip end portion 608 at an oblique angle with respect to an underlying surface of substrate 620.

As understood by those skilled in the art, the spring rate or stiffness of a beam effects the ratio between a force applied to the beam and the deflection that results from the applied force. In a cantilever beam, the spring rate tends to be linear provided that the deflections are small and the material of the beam does not yield. In a cantilevered beam, the spring rate (e.g., the ratio between applied force and beam deflection) is equal to $3EI/L^3$, where E and I represent elastic modulus of the beam material and the area moment of inertia of the beam cross section, respectively. The term L in the above equation represents the unsupported length of the beam at which the force is applied. Thus, for fulcrum-mounted beam 102 of probe 100 depicted in FIG. 2 for example, the spring rate or stiffness is proportional to the cube of the length of beam 102 that extends between fulcrum element 104 and contact tip 116 (i.e., the location at which force is applied to the beam).

Figure 9A:
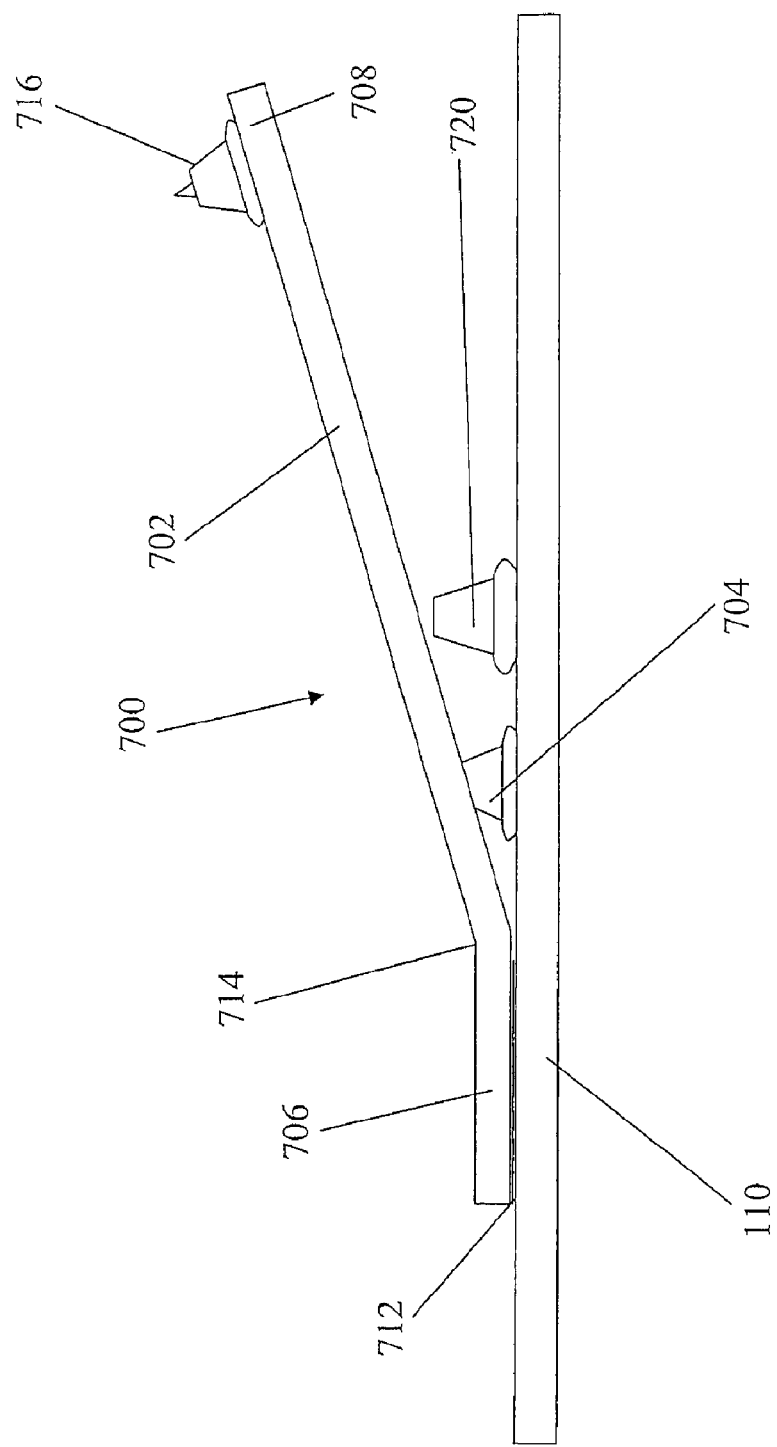
FIG. 9A is a side view of a probe and a substrate in accordance with yet another example embodiment of the present invention.

Referring to FIG. 9A, there is shown probe 700 according to an example embodiment of the invention that is adapted to provide a variable spring rate as described below. Probe 700 includes beam 702 and fulcrum element 704 located between base end portion 706 of beam 702 and tip end portion 708 of beam 702. Bend 714 is formed in beam 702 adjacent base end portion 706. Probe 700 also includes contact tip 716 located adjacent tip end portion 708 of beam 702. Base end portion 706 of beam 702 is attached to conductive region 112 located on or adjacent a surface of substrate 110 (e.g., by TAB bonding beam 702).

When beam 702 is loaded (e.g., upon contact between contact tip 716 and a DUT), beam 702 will initially deflect in a similar fashion as beam 102 of FIG. 2 provided that beam 702 and fulcrum element 704 of probe 700 are configured similarly to beam 102 and fulcrum element 104 of probe 100. In other words, the spring rate of beam 702 during the initial deflection of beam 702 will be proportional to the cube of the beam length between fulcrum element 704 and contact tip 716 (i.e., the unsupported beam length associated with the applied force). Referring to the graph shown in FIG. 9B, this initial spring rate is represented by line 718.

The probe 700 of FIG. 9A also includes secondary fulcrum element 720 located between base end portion 706 of beam 702 and tip end portion 708. The depicted secondary fulcrum element 720 comprises a stud bump secured to the substrate (e.g., by soldering, brazing, bonding, or adhesion) and formed to include a conical portion. As shown, secondary fulcrum element 720 is spaced from fulcrum element 704 and has a height such that a gap is initially provided between beam 702 and secondary fulcrum element 720 when beam 702 is unloaded. This gap, however, may be closed by deflection of beam 702. Thereafter, because of contact between beam 702 and secondary fulcrum element 720, the unsupported beam length associated with the beam stiffness will be shortened from that initially provided by fulcrum element 704 and will be equal to the length of beam extending between secondary fulcrum element 720 and contact tip 716.

As described above, the beam spring rate or stiffness for beam 702 is equal to 3EI/L3, where L is the unsupported beam length at which load is applied. Thus, the reduction in the unsupported beam length will increase the beam stiffness, which will be increased as the cube of the reduced L. Referring again to FIG. 9B, the increased beam spring rate provided by secondary fulcrum element 720, and the associated reduction in the unsupported beam length, L, is represented by line 722.

Figure 10A:
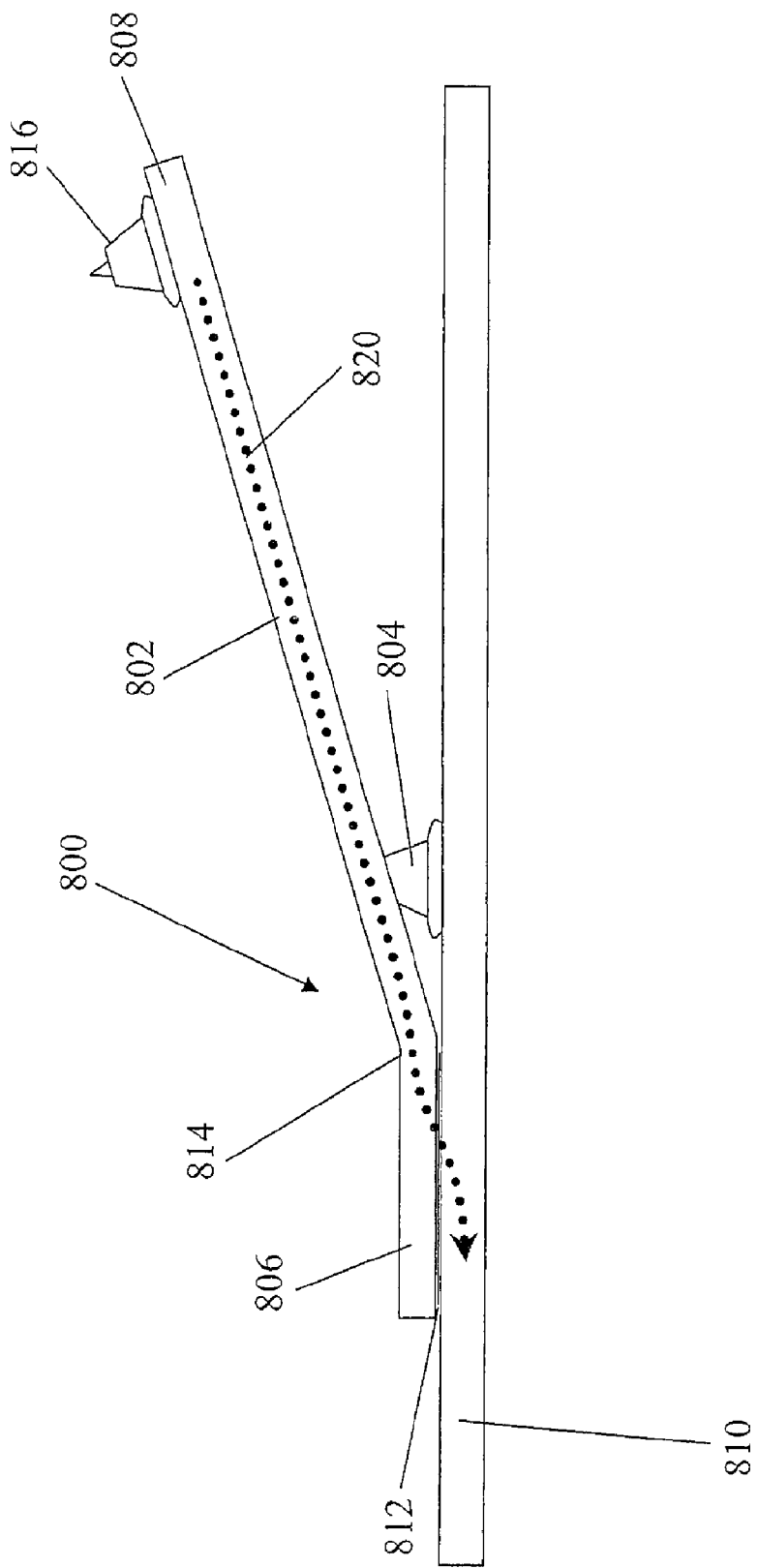
FIG. 10A is a side view of a probe and a substrate in accordance with an example embodiment of the present invention illustrating conductive pathways from a beam member of the probe to the substrate.
Figure 10B:
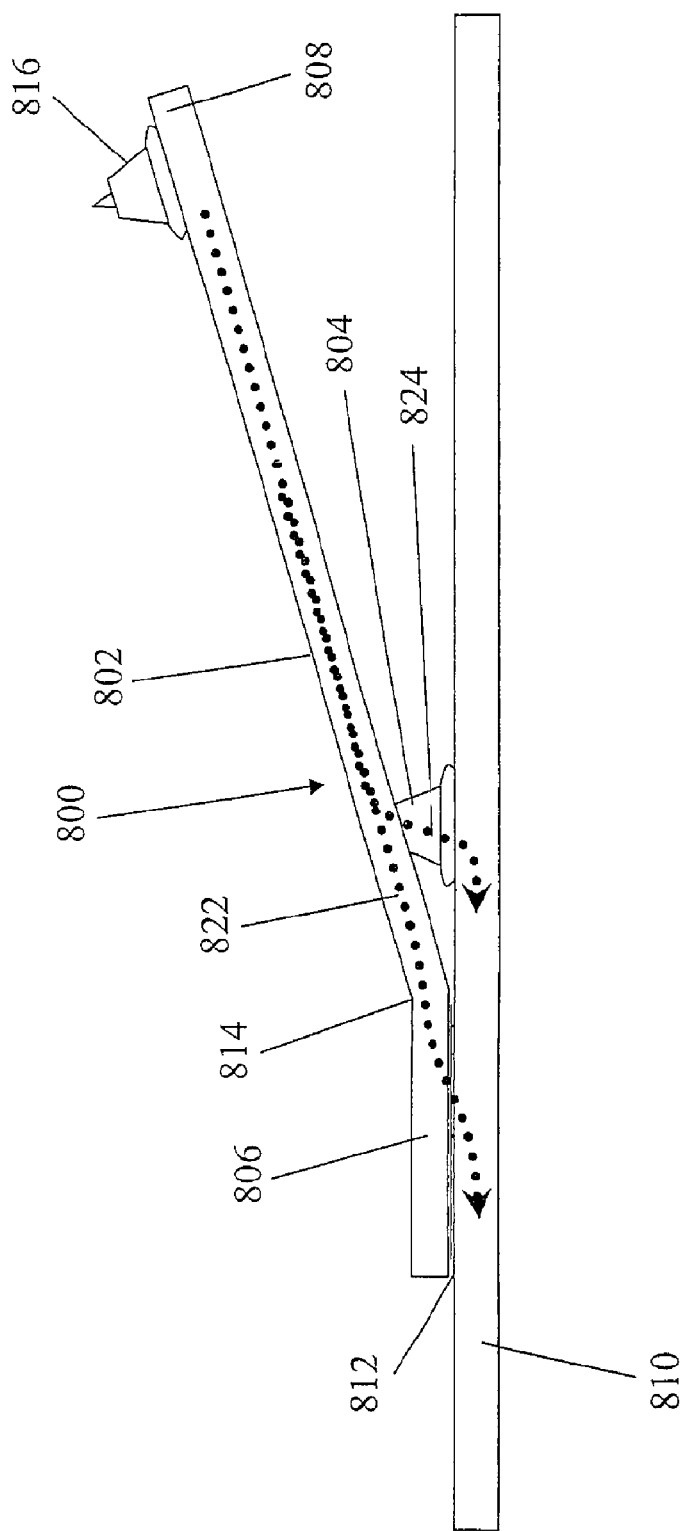
FIG. 10B is a side view of a probe and a substrate in accordance with another example embodiment of the present invention illustrating conductive pathways from a beam member of the probe to the substrate.
Figure 10C:
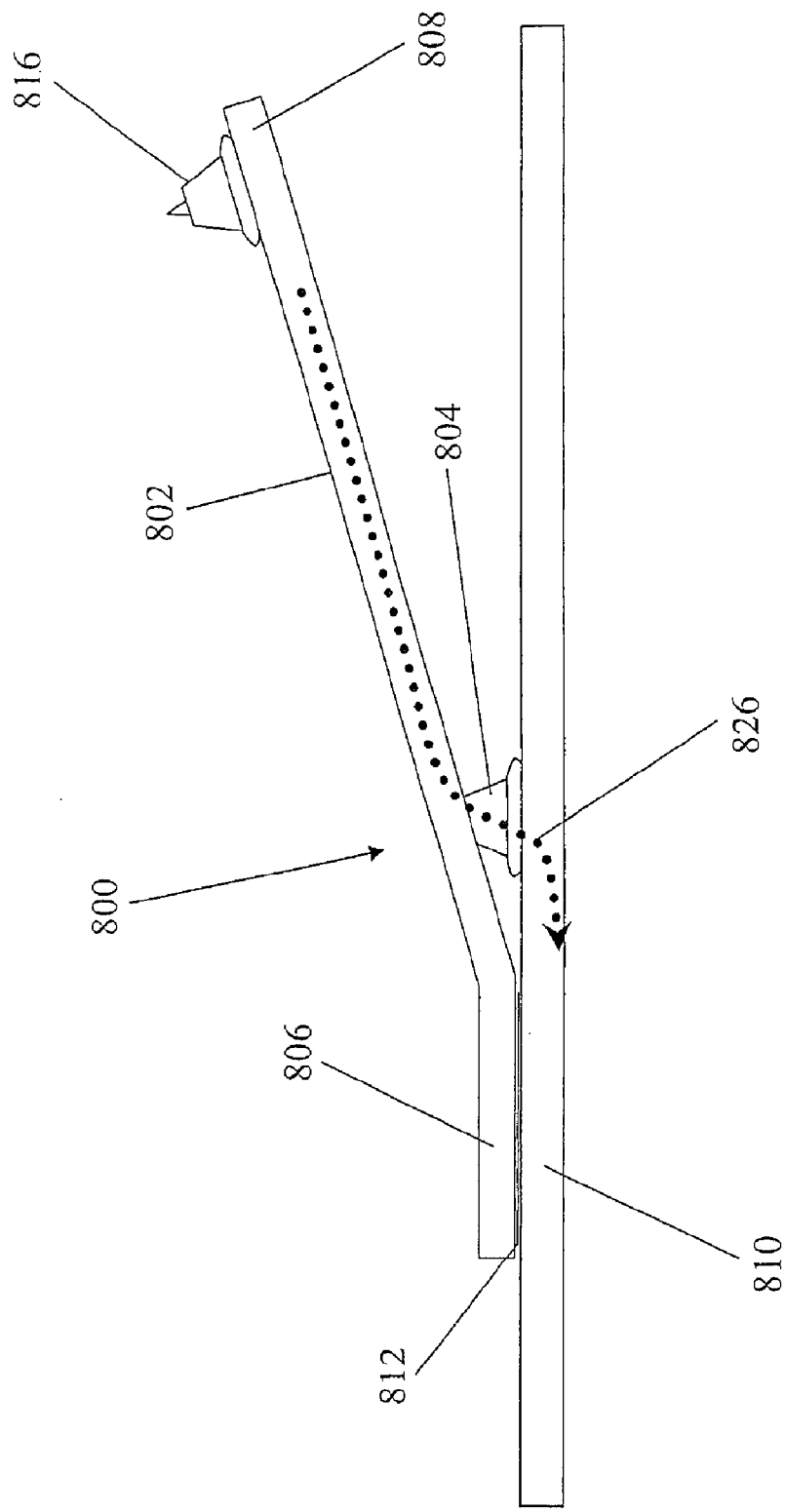
FIG. 10C is a side view of a probe and a substrate in accordance with yet another example embodiment of the present invention illustrating conductive pathways from a beam member of the probe to the substrate.

An intended use for the probes of the present invention is to provide electrical connection (as part of a probe card assembly) between a terminal of a DUT and a semiconductor device tester. Referring to FIGS. 10A through 10C, alternate conductive pathways for electrically connecting a DUT and a semiconductor device tester through a probe of the present invention are shown. The depicted probe 800 includes beam 802 and fulcrum element 804 located between base end portion 806 of beam 802 and tip end portion 808. Bend 814 is included in beam 802 adjacent base end portion 806. Probe 800 also includes contact tip 816 located adjacent tip end portion 808, for contact with a terminal of a DUT, for example. Base end portion 806 of beam 802 is attached to conductive region 812 of substrate 810 (e.g., by TAB bonding the beam 802).

Referring to FIG. 10A, conductive pathway 820 through probe 800 according to one embodiment of the invention extends from contact tip 816, between tip end portion 808 of beam 802 and base end portion 806, and into the substrate 810 through conductive region 812. The arrow head is included to indicate that pathway 820 extends into substrate 810 beyond that shown (e.g., through a conductive trace or fill provided in a space transformer). It should not be inferred from depicted pathway 820 that fulcrum element 804 cannot comprise an electrically conductive material. As shown, however, a conductive pathway connecting with, and extending through fulcrum element 804 (e.g., using a trace or fill on substrate 810) is not provided in the embodiment depicted in FIG. 10A.

Referring to FIG. 10B, there are shown conductive pathways 822, 824 through probe 800 according to an alternate embodiment of the invention. Pathway 822, similar to pathway 820 of FIG. 10A, extends from contact tip 816, between tip end portion 808 of beam 802 and base end portion 806, and into substrate 810 through conductive region 812. The other pathway 824 splits from pathway 822 at the location of fulcrum element 804, and extends through fulcrum element 804 and into substrate 810 (e.g., through a conductive trace or fill in or on substrate 810 that is not shown in FIG. 10B).

For example, conductive region 812 could extend beyond that shown in FIG. 10B such that fulcrum element 804 (as well as base end portion 806) is bonded to a portion of conductive region 812. Alternatively, a second conductive entry point into substrate 810 (other than conductive region 812) may be provided, where fulcrum element 804 is coupled to such a second conductive entry point into substrate 810.

Referring to FIG. 10C, there is shown conductive pathway 826 through probe 800 according to another alternate embodiment of the invention. As illustrated, no conductive pathway is provided through base end portion 806 of beam 802 (e.g., there are no conductive traces or fills in substrate 810 connected to terminal 812). Pathway 826 extends into beam 802 from contact tip 816 to the location of fulcrum element 804. Conductive pathway 826 extends through fulcrum element 804 and into the substrate 810 (e.g., through a conductive region of substrate 810 not shown in FIG. 10C).

Figure 11A:
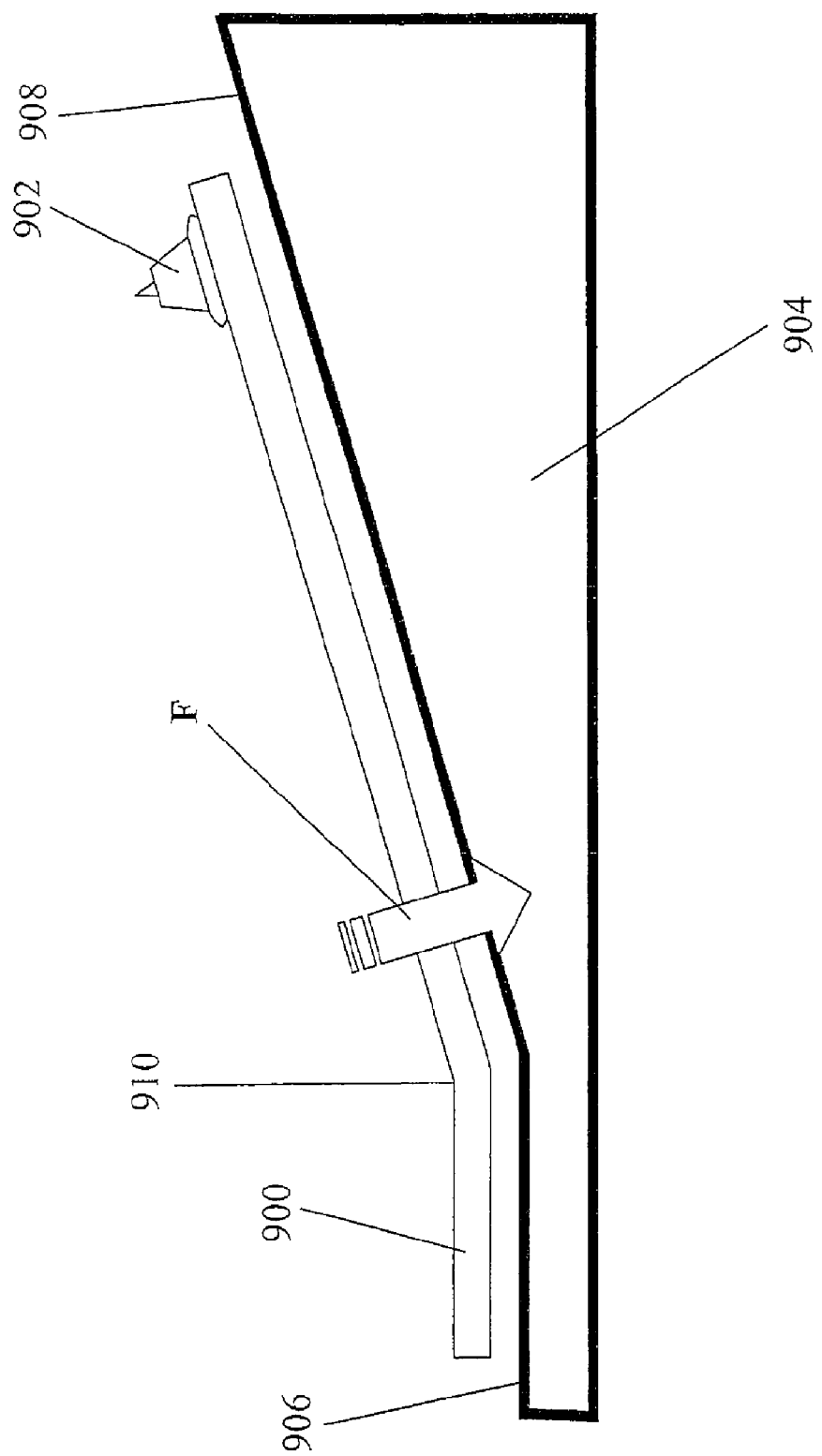
FIG. 11A is a side view illustrating a probe beam and a probe form in accordance with an example embodiment of the present invention.

In probes according to various example embodiments of the present invention illustrated herein (e.g., FIGS. 2 through 4), the beam of the probe includes a bend adjacent the base end portion of the beam. Referring to FIG. 11A, a method of forming such a bend in a beam 900 is illustrated. Contact tip 902, shown as a formed stud bump, is attached to the depicted beam 900. The beam is positioned adjacent beam form 904 having first and second surfaces 906, 908 that are oriented at an oblique angle with respect to each other. A force, shown as F, is applied to the beam 900 to deform the beam 900 against the beam form 904, such that a bend 910 is formed in the beam 900 adjacent a juncture between the first and second surfaces 906, 908 of beam form 904.

Figure 11B:
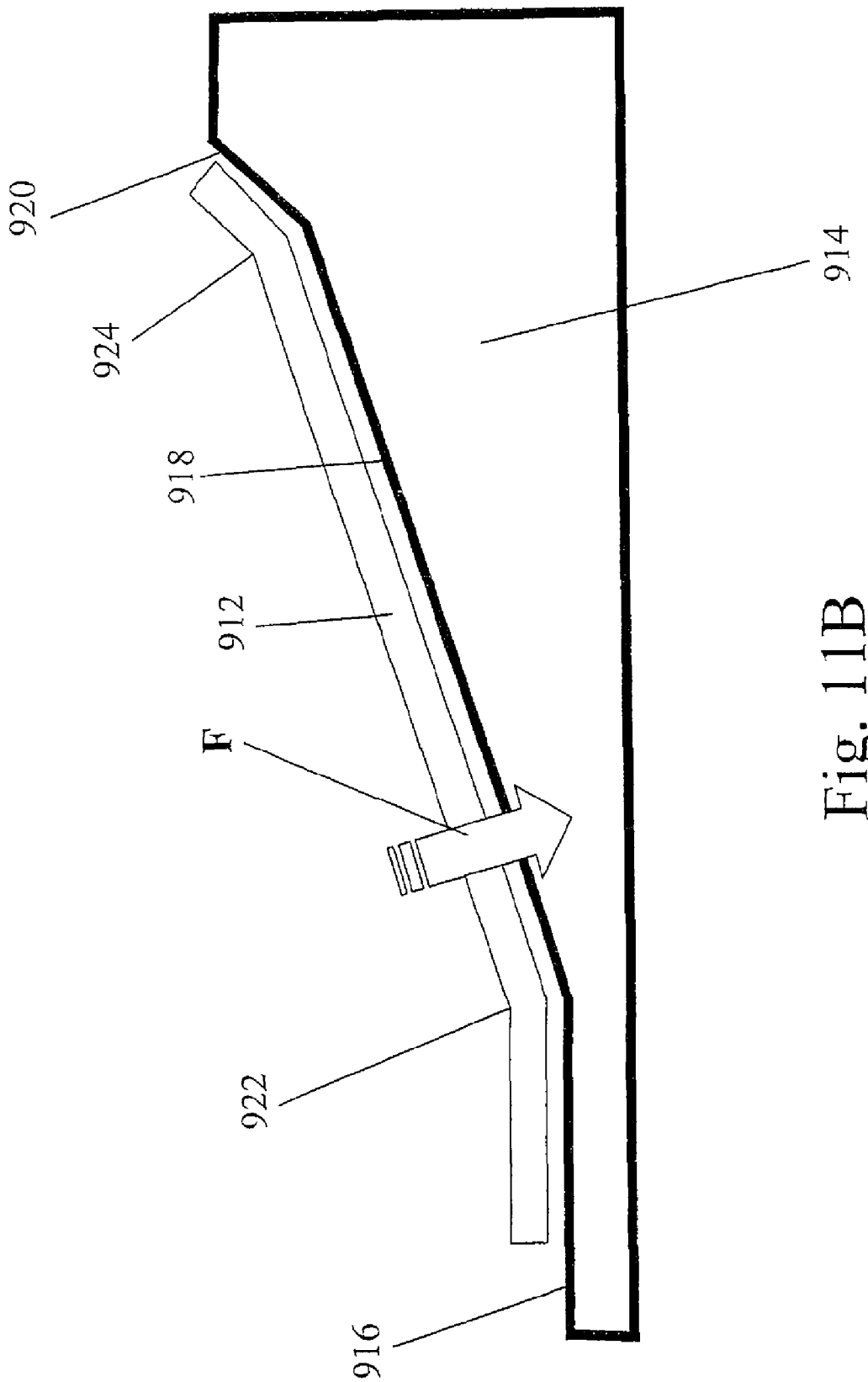
FIG. 11B is a side view illustrating another probe beam and another probe form in accordance with an example embodiment of the present invention.

As described above, probe 300 illustrated in FIG. 4 does not include a contact tip distinct from beam 302, and instead includes a second bend adjacent tip end portion 308 of beam 302. Referring to FIG. 11B, there is illustrated a method of forming such a bend in beam 912. Beam 912 is positioned adjacent beam form 914 that, similar to beam form 904, includes first and second surfaces 916, 918 obliquely oriented with respect to each other. The beam form 914 also includes third surface 920 that is angled with respect to second surface 918. A force, shown as F, is applied to beam 912 to deform beam 912 against beam form 914, such that first bend 922 is formed in beam 912 adjacent a juncture between surfaces 916, 918 and second bend 924 is formed in beam 912 adjacent a juncture between surfaces 918, 920.

Although the present invention has been described primarily with respect to the inclusion of a fulcrum element in each probe, it is not limited thereto. According to certain example embodiments of the present invention, such fulcrum elements may be omitted from the probe. For example, FIGS. 12A-12B illustrate such example probes, where bends defined in the beams of the probes provide adequate fulcrum action in certain applications.

Figure 12A:
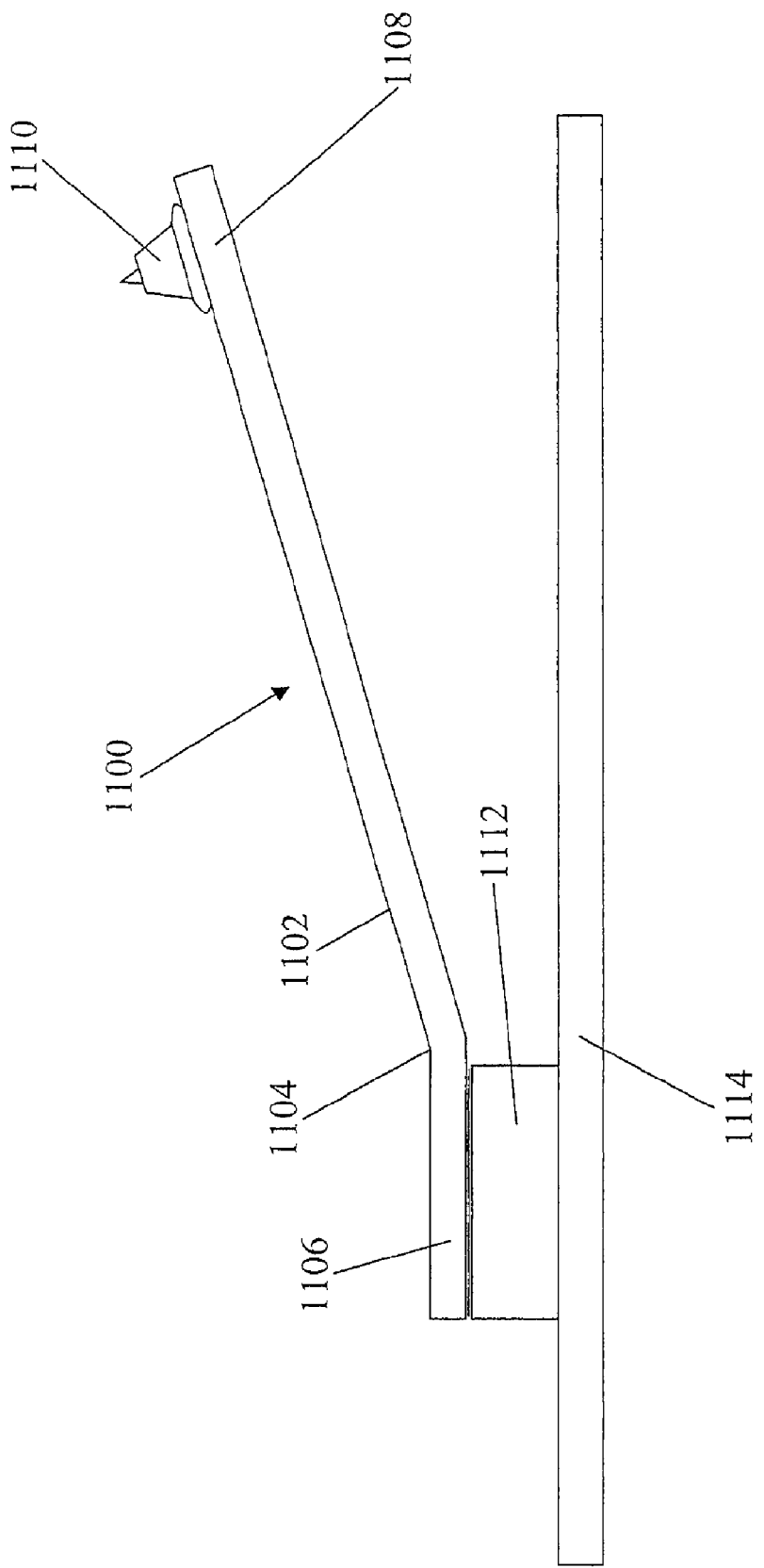
FIG. 12A is a side view of a probe and a substrate in accordance with yet another example embodiment of the present invention.

Referring now to FIG. 12A, probe 1100 includes beam 1102 having base end portion 1106 and tip end portion 1108. Beam 1102 defines bend 1104 along its length between base end portion 1106 and tip end portion 1108. Contact tip 1110 is provided adjacent tip end portion 1108. Probe 1100 also includes post 1112. Beam 1102 is coupled to post 1112 at base end portion 1106, and post 1112 is coupled to substrate 1114 (e.g., through a conductive region of substrate 1114 such as a trace not illustrated in FIG. 12A).

Figure 12B:
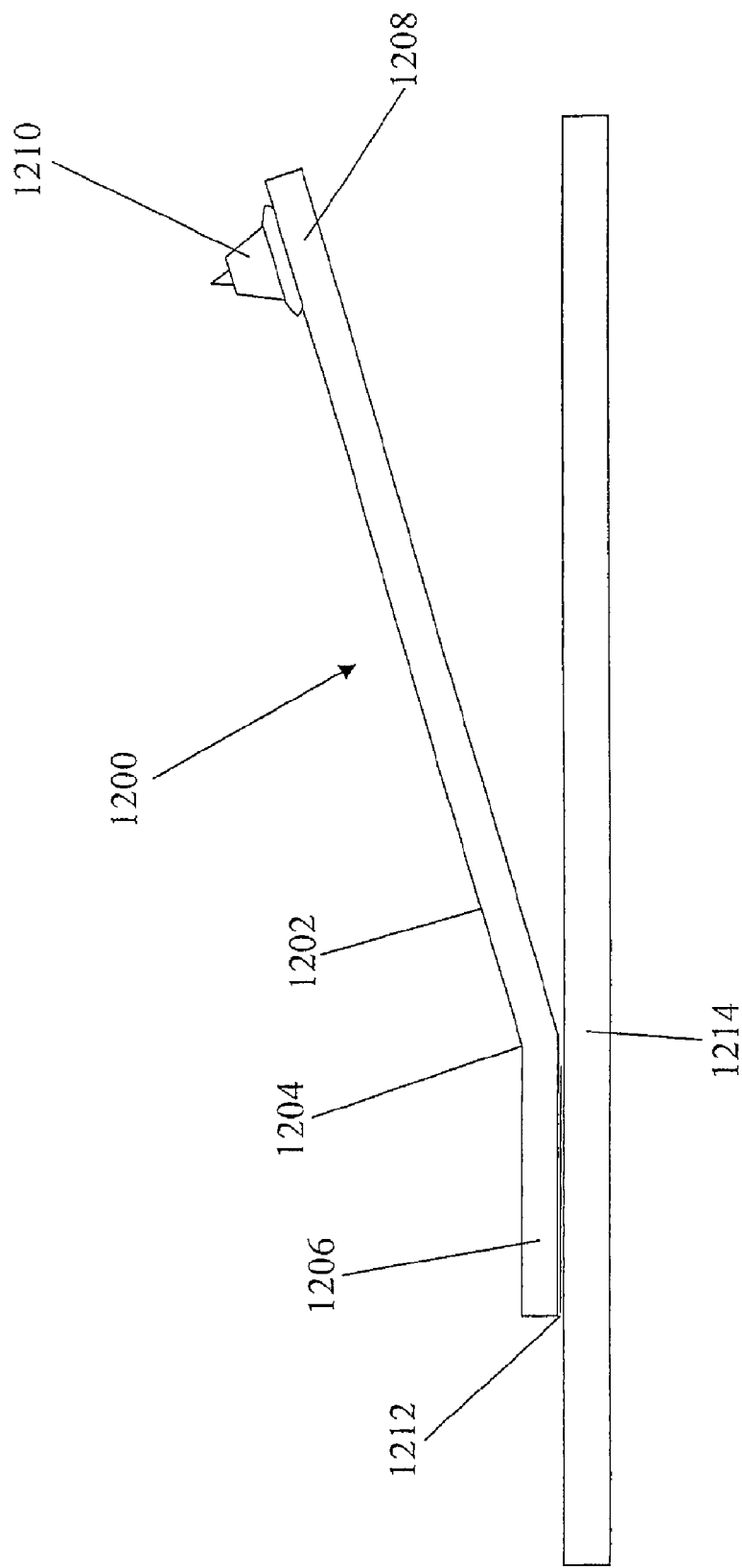
FIG. 12B is a side view of a probe and a substrate in accordance with yet another example embodiment of the present invention.

Referring now to FIG. 12B, probe 1200 includes beam 1202 having base end portion 1206 and tip end portion 1208. Beam 1202 defines bend 1204 along its length between base end portion 1206 and tip end portion 1208. Contact tip 1210 is provided adjacent tip end portion 1208. In contrast to probe 1100 illustrated in FIG. 12A, probe 1200 does not include a post such as post 1112 illustrated in FIG. 12A. Rather, beam 1202 is coupled to conductive region 1212 of substrate 1214 at base end portion 1206.

Figure 13A:
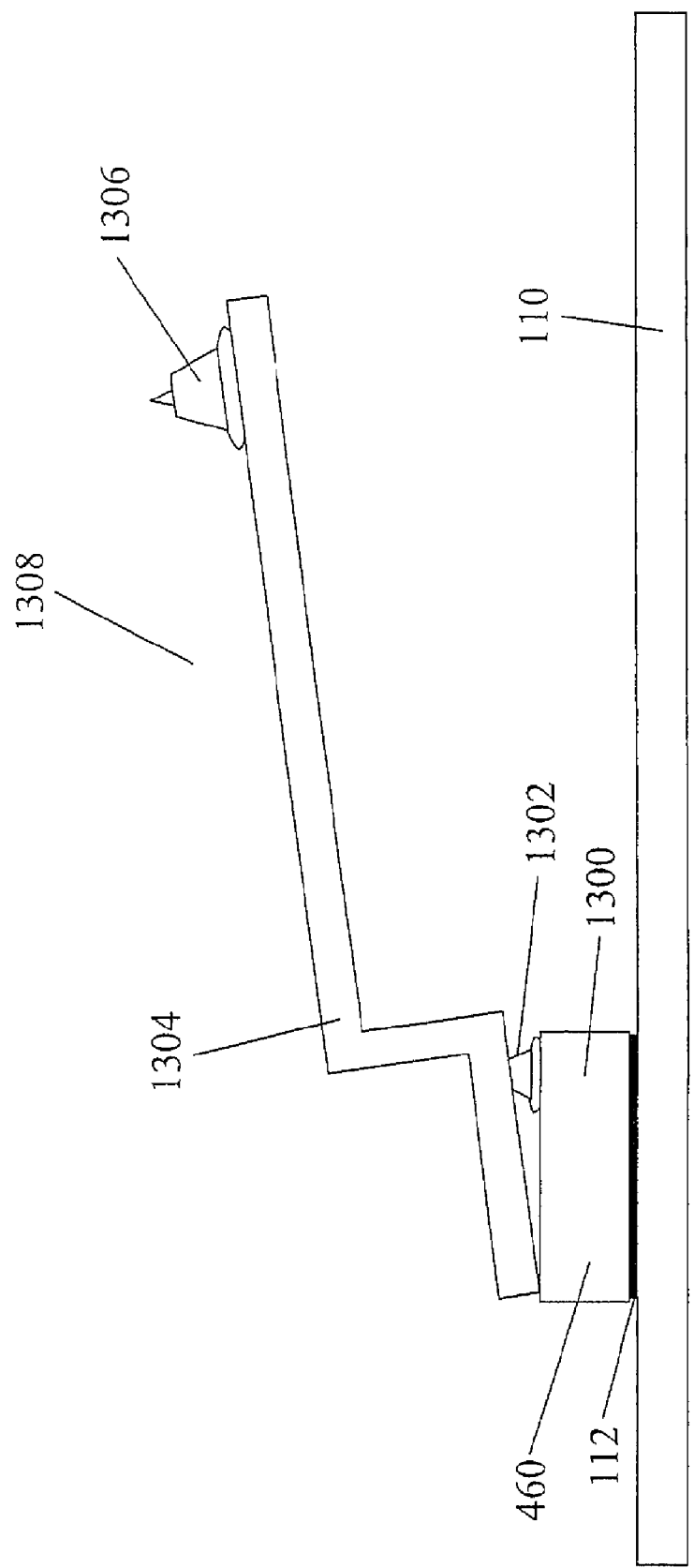
FIG. 13A is a side view of a probe and a substrate in accordance with yet another example embodiment of the present invention.

FIGS. 13A-13C and 14A-14B illustrate alternative probe configurations according to various example embodiments of the present invention. Referring specifically to FIG. 13A, probe 1308 includes element 1304 coupled to post 1300, where post 1300 is coupled (e.g., conductively coupled) to conductive region 112 of substrate 110. Fulcrum element 1302 is provided between post 1300 and a portion of element 1304. Contact tip 1306 is provided adjacent an end portion of element 1304.

Figure 13B:
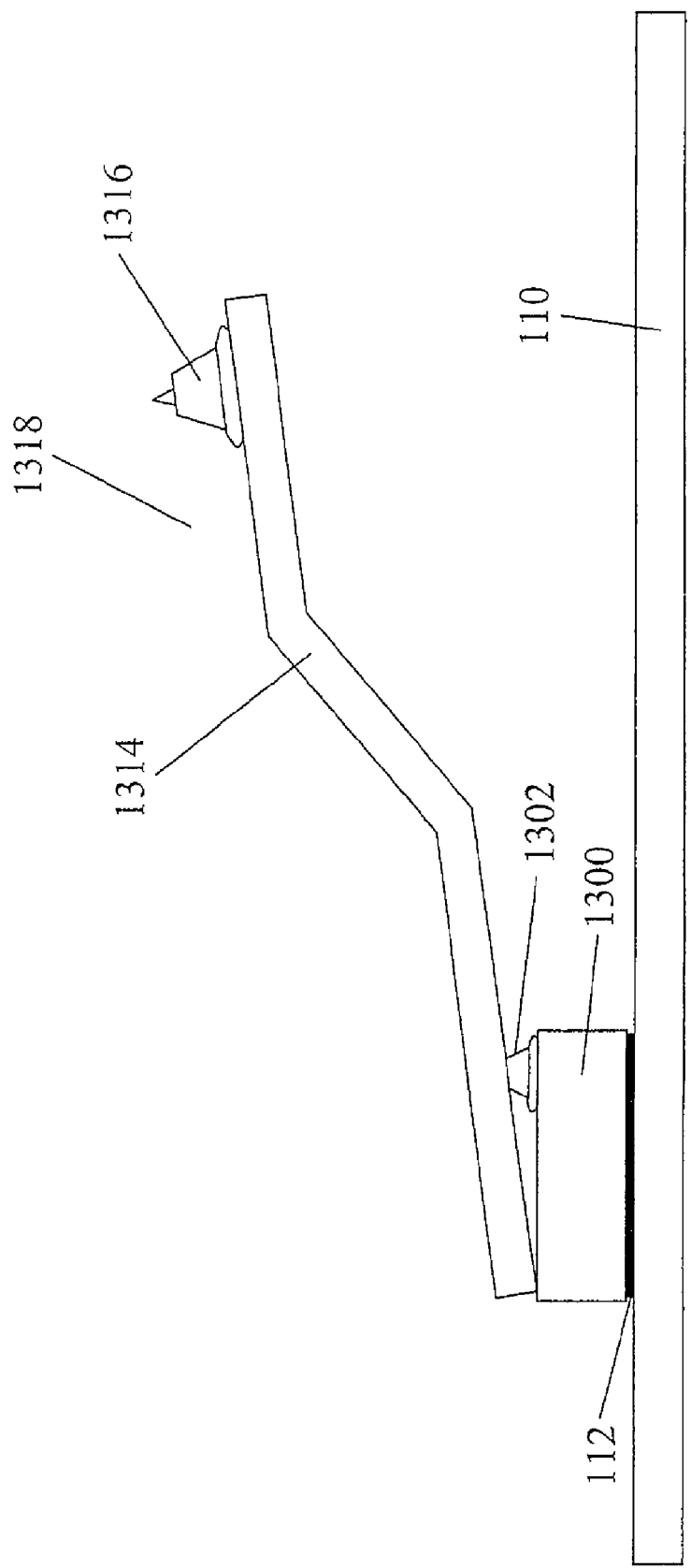
FIG. 13B is a side view of a probe and a substrate in accordance with yet another example embodiment of the present invention.

Referring specifically to FIG. 13B, probe 1318 includes element 1314 coupled to post 1300, where post 1300 is coupled (e.g., conductively coupled) to conductive region 112 of substrate 110. Fulcrum element 1302 is provided between post 1300 and a portion of element 1314. Contact tip 1316 is provided adjacent an end portion of element 1314.

Figure 13C:
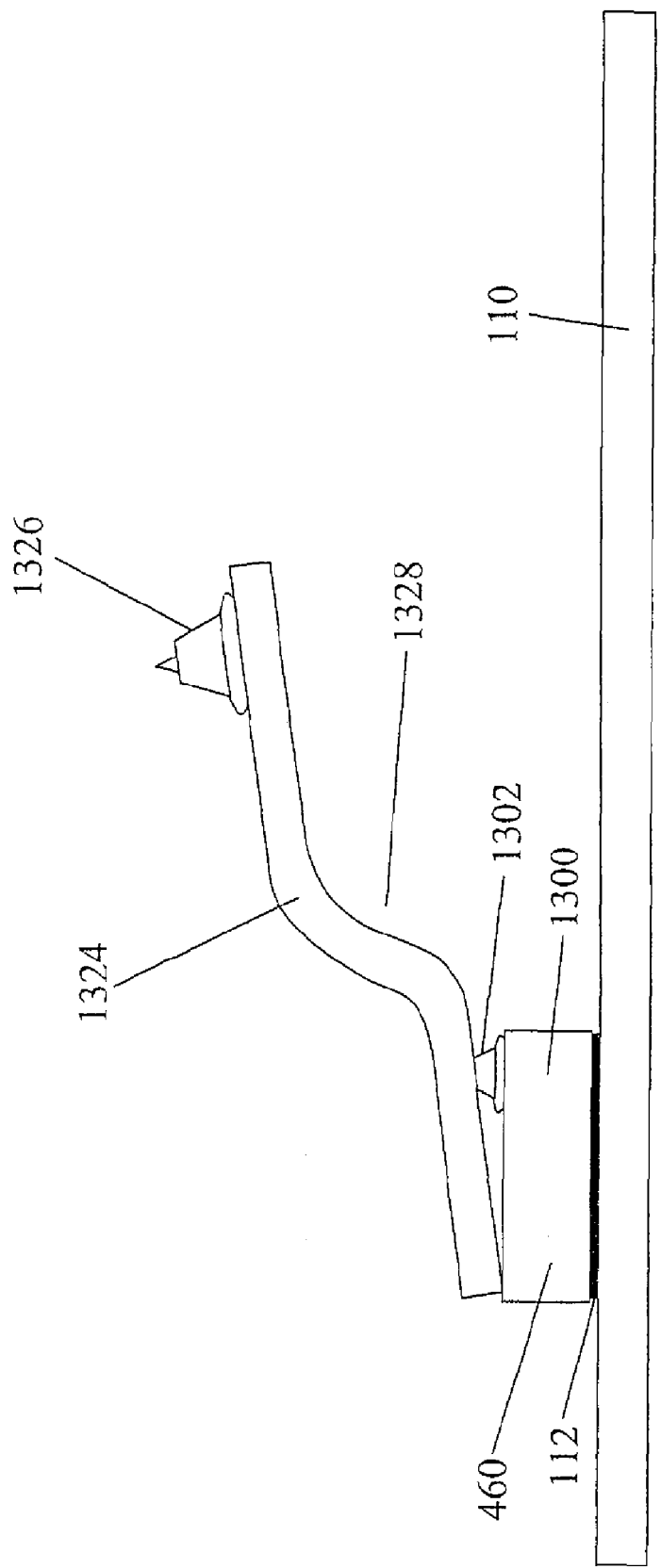
FIG. 13C is a side view of a probe and a substrate in accordance with yet another example embodiment of the present invention.

Referring specifically to FIG. 13C, probe 1328 includes element 1324 coupled to post 1300, where post 1300 is coupled (e.g., conductively coupled) to conductive region 112 of substrate 110. Fulcrum element 1302 is provided between post 1300 and a portion of element 1324. Contact tip 1326 is provided adjacent an end portion of element 1324.

Referring specifically to FIG. 14A, probe 1400 includes beam 1402 coupled (e.g., conductively coupled) to conductive region 112 of substrate 110. Fulcrum element 1404 and 1406 are provided between beam 1402 and conductive region 112. The use of multiple fulcrum elements (e.g., fulcrum elements 1404 and 1406) may provide a beneficial action during probing such as that described above with respect to FIG. 9A. Contact tip 1408 is provided adjacent an end portion of beam 1402.

Figure 14B:
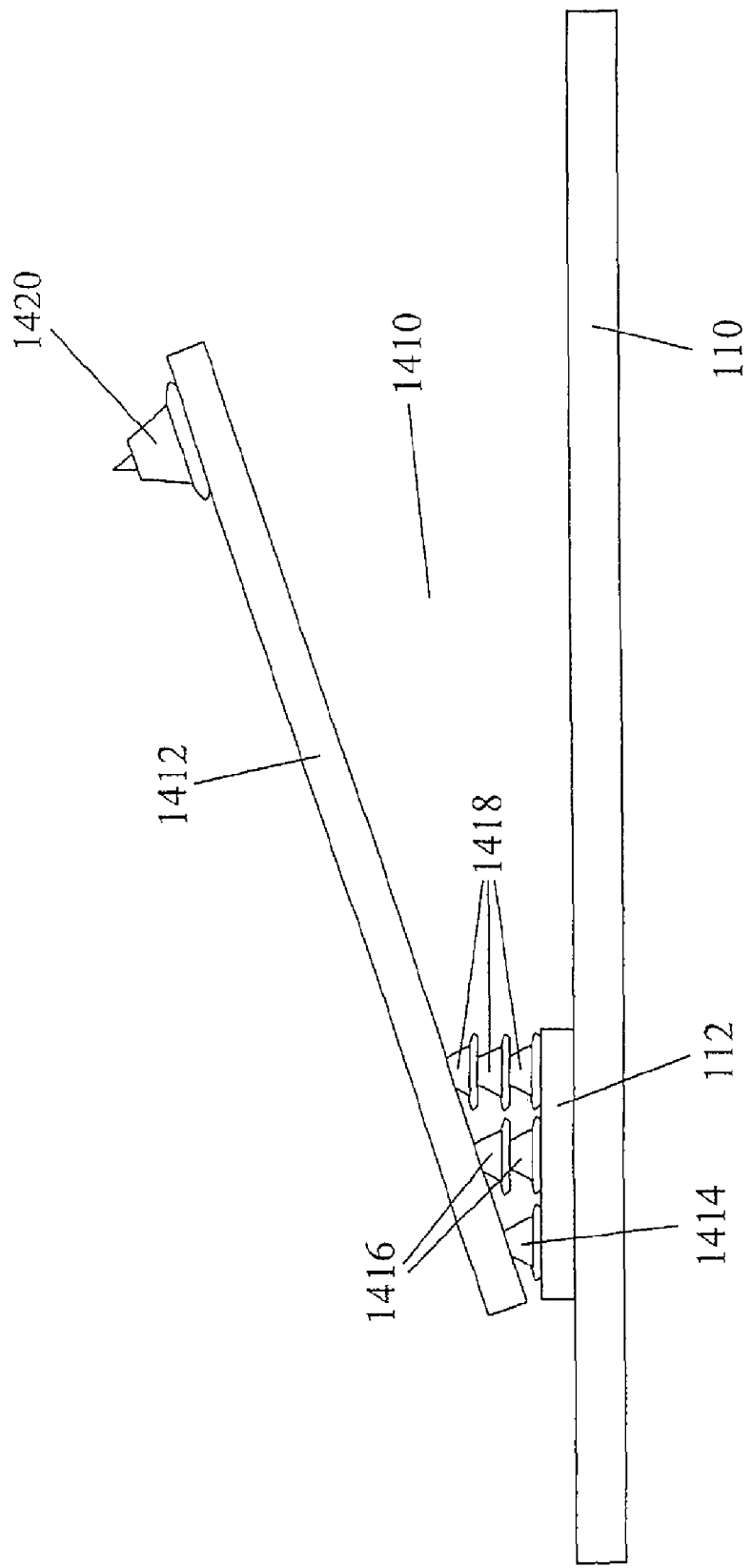
FIG. 14B is a side view of a probe and a substrate in accordance with yet another example embodiment of the present invention.

Referring specifically to FIG. 14B, probe 1410 includes beam 1412 coupled (e.g., conductively coupled) to conductive region 112 of substrate 110. Fulcrum elements 1414, 1416, and 1418 are provided between beam 1412 and conductive region 112. As shown in FIG. 14B, elements 1416 and 1418 are provided in stacked configurations. For example, such stacks may be provided through successively bump bonding conductive bumps (e.g., conductive bumps 1416). The use of multiple fulcrum elements (e.g., fulcrum elements 1414, 1416, 1418) may provide a beneficial action during probing such as that described above with respect to FIG. 9A. Contact tip 1420 is provided adjacent an end portion of beam 1412.

The elements (e.g., posts, beams, contact tips, etc.) included in the various example probes of the present invention may include conductive materials which may not have a desired property such as conductivity, adhesiveness during bonding, or hardness. Thus, while not explicitly described in connection with each illustrated embodiment herein, it is clear that certain of the elements may be coated, plated, or sputtered as desired to provide such property. For example, when coupling (1) a beam of a probe to (2) a post of a probe using certain bonding techniques (e.g., TAB bonding), it may be desirable to sputter a malleable material on the post prior to bonding the beam thereto. As a more specific example, if a post and a beam are formed of nickel manganese, it may be desirable to sputter gold onto the post prior to bonding the beam thereto to provide a more robust bond.

While the present invention has been described primarily with respect to probes for a probe card assembly for wafer testing, it is contemplated that certain of the concepts disclosed herein may be applied to other testing technologies such as package testing of packaged integrated circuits.

While the present invention has been described primarily with respect to stud bumped fulcrum elements, it is not limited thereto. Any of a number of techniques or materials may be used to form the fulcrum elements. For example, the fulcrum element could be a plated-up feature on the substrate, similar to the plating-up of a post element. Another example would be a pre-formed pick-and-place type element bonded to the substrate.

The present invention may be embodied in other specific forms without departing from the spirit or essential attributes thereof. Although the invention has been described and illustrated with respect to the example embodiment thereof, it should be understood by those skilled in the art that the foregoing and various other changes, omissions and additions may be made therein and thereto, without parting from the spirit and scope of the present invention.

What is claimed is:

1. A probe card assembly comprising:
   a substrate;
   a conductive post, wherein the bottom face of the conductive post is connected to the substrate;
   a beam having a base end portion and a tip end portion, wherein the beam has at least two bends in a portion of the beam between the base end portion and the tip end portion, wherein each of the at least two bends forms an angle of approximately 90 degrees, and wherein the base end portion is approximately parallel to the tip end portion; and
   a fulcrum element comprising a stud bump secured to the conductive post and in contact with the portion of the beam that is between the base end portion of the beam and the tip end portion of the beam, the stud bump being adapted for contact with the beam such that both the base end portion and the tip end portion are cantilevered by the stud bump at an oblique angle with respect to the surface of the substrate.

2. The probe according to claim 1, wherein the stud bump includes an upper surface that is sloped at an angle to match an angle of a lower surface of the portion of the beam that is oriented at the oblique angle.

3. The probe according to claim 1, wherein the stud bump includes a tapered body.

4. The probe according to claim 1 further comprising a contact tip adjacent the tip end portion of the beam.

5. The probe according to claim 4, wherein the contact tip comprises a stud bump secured to the beam.

6. A probe card assembly comprising:
   a substrate;
   a conductive post, wherein the bottom face of the conductive post is connected to the substrate;
   a beam having a base end portion and a tip end portion; and
   at least three fulcrum elements, wherein each fulcrum element comprises one or more stud bumps connected to the conductive post and stacked substantially perpendicular to the substrate, wherein the at least three fulcrum elements are arranged on the conductive post in order of increasing height from the base end portion to the tip end portion, and wherein each of the at least three fulcrum elements being adapted for contact with the beam such that the beam is cantilevered by the at least three fulcrum elements at an oblique angle with respect to the surface of the substrate such that when the tip end portion is not in contact with a device under test, the tip end portion is further from the substrate than the base end portion.

7. The probe according to claim 6, wherein a plurality of the stud bumps each includes an upper surface that is sloped at an angle to match an angle of a lower surface of the portion of the beam that is oriented at the oblique angle.

8. The probe according to claim 6, wherein each of the stud bumps includes a tapered body.

9. The probe according to claim 6, further comprising a contact tip adjacent the tip end portion of the beam.

10. The probe according to claim 9, wherein the contact tip comprises a stud bump secured to the beam.

* * * * *